US011722148B2

(12) United States Patent
Fruchtman et al.

(10) Patent No.: US 11,722,148 B2
(45) Date of Patent: Aug. 8, 2023

(54) SYSTEMS AND METHODS OF DATA COMPRESSION

(71) Applicants: Ariel Scientific Innovations Ltd., Ariel (IL); Bar-Ilan University, Ramat-Gan (IL)

(72) Inventors: Aharon Fruchtman, Karney Shomron (IL); Yoav Gross, Revava (IL); Dana Shapira, Modiin (IL); Shmuel Tomi Klein, Rehovot (IL)

(73) Assignees: Ariel Scientific Innovations Ltd., Ariel (IL); Bar-Ilan University, Ramat-Gan (IL)

( * ) Notice: Subject to any disclaimer, the term of this patent is extended or adjusted under 35 U.S.C. 154(b) by 0 days.

(21) Appl. No.: 17/788,355

(22) PCT Filed: Dec. 23, 2020

(86) PCT No.: PCT/IL2020/051324
§ 371 (c)(1),
(2) Date: Jun. 23, 2022

(87) PCT Pub. No.: WO2021/130754
PCT Pub. Date: Jul. 1, 2021

(65) Prior Publication Data
US 2023/0041067 A1 Feb. 9, 2023

Related U.S. Application Data

(60) Provisional application No. 62/952,516, filed on Dec. 23, 2019.

(51) Int. Cl.
*H03M 7/00* (2006.01)
*H03M 7/30* (2006.01)

(52) U.S. Cl.
CPC ....... *H03M 7/3077* (2013.01); *H03M 7/3064* (2013.01); *H03M 7/3066* (2013.01); *H03M 7/6011* (2013.01)

(58) Field of Classification Search
USPC ...................................... 341/50, 51
See application file for complete search history.

(56) References Cited

U.S. PATENT DOCUMENTS 4,882,754 A   11/1989  Weaver et al.
5,812,071 A    9/1998  Kairouz
(Continued)

FOREIGN PATENT DOCUMENTS

CN     102811114    12/2012
CN     107483059    12/2017
WO  WO 2021/130754   7/2021

OTHER PUBLICATIONS

International Preliminary Report on Patentability dated Oct. 7, 2021 From the International Bureau of WIPO Re. Application No. PCT/IL2020/050332. (6 Pages).
(Continued)

Primary Examiner — Jean B Jeanglaude

(57) ABSTRACT

There is provided a computer implemented method of compressing a baseline dataset comprising a sequence of a plurality of instances of a plurality of unique data elements, the method comprising: providing a weight function that calculates an increasing value for a weight for each one of the plurality of instances of each one of the plurality of unique data elements in the baseline dataset, as a function of increasing number of previously processed sequential locations of each of the plurality of instances of each respective unique data element within the baseline dataset relative to a current sequential location of the baseline dataset, computing an encoding for the baseline dataset according to a distribution of the weight function computed for the plural-
(Continued)

ity of unique data elements in the baseline dataset, and creating a compressed dataset according to the encoding.

20 Claims, 10 Drawing Sheets

(56) References Cited

U.S. PATENT DOCUMENTS

| | | | |
|---|---|---|---|
| 5,945,933 A | 8/1999 | Kalkstein | |
| 7,558,685 B2 | 7/2009 | Wegener | |
| 8,427,346 B2 | 4/2013 | Potkonjak | |
| 9,747,910 B2 | 8/2017 | Kim et al. | |
| 10,169,359 B1 | 1/2019 | Pinho et al. | |
| 2004/0113820 A1 | 6/2004 | Leanza | |
| 2004/0145503 A1 | 7/2004 | Blanch et al. | |
| 2004/0150538 A1 | 8/2004 | Kim | |
| 2008/0111721 A1 | 5/2008 | Reznik | |
| 2008/0111722 A1 | 5/2008 | Reznik | |
| 2009/0140895 A1 | 6/2009 | Owsley et al. | |
| 2009/0177657 A1* | 7/2009 | Carroll | G06F 7/24 |
| 2011/0025532 A1 | 2/2011 | Markram | |
| 2012/0127001 A1* | 5/2012 | Owsley | H03M 7/40 341/65 |
| 2017/0063392 A1 | 3/2017 | Kalevo et al. | |
| 2017/0346502 A1 | 11/2017 | Cideciyan et al. | |
| 2020/0364545 A1 | 11/2020 | Shattil | |
| 2021/0358577 A1* | 11/2021 | Zhang | G06N 3/084 |
| 2022/0094370 A1 | 9/2022 | Shapira et al. | |

OTHER PUBLICATIONS

International Search Report and the Written Opinion dated Jun. 4, 2020 From the International Searching Authority Re. Application No. PCT/IL2020/050332. (13 Pages).
International Search Report and the Written Opinion dated Mar. 25, 2021 From the International Searching Authority Re. Application No. PCT/IL2020/051324. (10 Pages).
Notice of Allowance dated Feb. 14, 2022 from US Patent and Trademark Office Re. U.S. Appl. No. 17/438,552. (13 pages).
Fruchtman et al. "Bidirectional Adaptive Compression", Proceedings of Prague Stringology Conference, PSC 2019, p. 92-101, Aug. 2019.
Gallager "Variations on A Theme by Huffman", IEEE Transactions on Information Theory, IT-24(6): 668-674, Nov. 1978.
Huffman "A Method for the Construction of Minimum-Redundancy Codes", Proceedings of the I.R.E., 40(9): 1098-1101, Sep. 1952.
Klein et al. "Forward Looking Huffman Coding", Computer Science—Theory and Applications, Proceedings of the 14th International Computer Science Symposium, CSR 2019, Novosibirsk, Russia, Jul. 1-5, 2019, LNCS 11532: 203-214, Jul. 1, 2019.
Knuth "Dynamic Huffman Coding", Journal of Algorithms, 6(2): 163-180, Jun. 1985.
Moffat "World-Based Text Compression", Software—Practice and Experience, 19(2): 185-198, Feb. 1989.
Nelson et al. The Data Compression Book, 2nd Ed., 403 P., 1995. (Part 1).
Nelson et al. The Data Compression Book, 2nd Ed., 403 P., 1995. (Part 2).
Nelson et al. The Data Compression Book, 2nd Ed., 403 P., 1995. (Part 3).
Nelson et al. The Data Compression Book, 2nd Ed., 403 P., 1995. (Part 4).
Storer et al. "Data Compression Via Textual Substitution", Journal of Association for Computing Machinery, 29(4): 928-951, Oct. 1982.
Vitter "Design and Analysis of Dynamic Huffman Codes", Journal of the Association for Computing Machinery, 34(4): 825-845, Oct. 1997.

* cited by examiner

FIG. 3

| | $H_0$ | static | b-adp | f-adp | b-2 (k) | | b-weight (k) | |
|---|---|---|---|---|---|---|---|---|
| SOURCES | 69.21 | 69.21 | 69.21 | 69.21 | 64.38 | (3,104) | 62.58 | (318) |
| XML | 65.37 | 65.38 | 65.38 | 65.38 | 65.05 | (35,840) | 64.93 | (6,314) |
| DNA | 24.78 | 24.77 | 24.78 | 24.77 | 24.74 | (141,312) | 24.44 | (85) |
| ENGLISH | 56.61 | 56.61 | 56.61 | 56.61 | 56.24 | (26,112) | 56.00 | (3,775) |
| PITCHES | 70.41 | 70.42 | 70.42 | 70.42 | 57.55 | (385) | 46.05 | (32) |
| PROTEINS | 52.44 | 52.44 | 52.44 | 52.44 | 52.08 | (34,304) | 51.59 | (407) |

FIG. 7

| | r | $H_r$ | PPM | b-2 (k) | | b-weight (k) | |
|---|---|---|---|---|---|---|---|
| SOURCES | 2 | 37.65 | 37.93 | 33.87 | (422) | 29.06 | (13) |
| | 3 | 27.68 | 28.97 | 26.81 | (296) | 25.36 | (9) |
| XML | 2 | 25.09 | 25.24 | 22.76 | (832) | 21.88 | (81) |
| | 3 | 16.53 | 17.21 | 15.80 | (472) | 15.86 | (42) |
| DNA | 2 | 24.06 | 24.06 | 23.99 | (4,056) | 23.00 | (129) |
| | 3 | 24.00 | 24.00 | 23.95 | (3,406) | 23.90 | (216) |
| ENGLISH | 2 | 36.53 | 36.62 | 35.90 | (1,505) | 35.55 | (188) |
| | 3 | 29.83 | 30.27 | 29.73 | (800) | 29.89 | (110) |
| PITCHES | 2 | 51.74 | 52.23 | 48.21 | (306) | 44.73 | (14) |
| | 3 | 48.21 | 47.81 | 46.13 | (252) | 47.81 | — |
| PROTEINS | 2 | 51.82 | 51.84 | 49.03 | (160) | 49.82 | (70) |
| | 3 | 50.43 | 50.70 | 48.72 | (126) | 49.14 | (72) |

FIG. 9

|  | static | b-adp | f-adp | b-2 (k) | b-weight (k) |
|---|---|---|---|---|---|
| SOURCES | 69.48 | 69.48 | 69.48 | 26.44 (24) | 26.30 (22) |
| XML | 65.54 | 65.54 | 65.54 | 13.11 (24) | 13.05 (24) |
| DNA | 24.97 | 24.98 | 24.97 | 23.02 (34) | 23.01 (34) |
| ENGLISH | 57.07 | 57.07 | 57.07 | 29.41 (36) | 29.33 (36) |
| PITCHES | 69.32 | 69.32 | 69.31 | 53.34 (119) | 53.26 (120) |
| PROTEINS | 52.64 | 52.65 | 52.64 | 46.71 (39) | 46.62 (38) |

FIG. 10

SYSTEMS AND METHODS OF DATA COMPRESSION

RELATED APPLICATION

This application is a National Phase of PCT Patent Application No. PCT/IL2020/051324 having International filing date of Dec. 23, 2020, which claims the benefit of priority under 35 USC § 119(e) of U.S. Provisional Patent Application No. 62/952,516 filed on Dec. 23, 2019. The contents of the above applications are all incorporated by reference as if fully set forth herein in their entirety.

BACKGROUND

The present invention, in some embodiments thereof, relates to data compression and, more specifically, but not exclusively, to systems and methods for creation of a compressed dataset.

A compressed dataset stores the same information as the original non-compressed dataset, in a reduced size, for example, requiring a smaller amount of memory for storage. Compression may be lossless, where size is reduced by identifying and removing redundancy. No information is lost in lossless compression. Compression of a dataset is sometimes referred to as encoding. The original dataset is recovered from the compressed dataset by a process sometimes referred to as decoding. Compressed datasets require fewer data storage resources for storage, and/or require fewer network resources for transmission, in comparison to the larger original (i.e., non-compressed) dataset.

Huffman coding is one example of a process used for lossless data compression. Another example of lossless data compression is Arithmetic coding.

SUMMARY

According to a first aspect, a computer implemented method of compressing a baseline dataset comprising a sequence of a plurality of instances of a plurality of unique data elements, comprises: providing a weight function that calculates an increasing value for a weight for each one of the plurality of instances of each one of the plurality of unique data elements in the baseline dataset, as a function of increasing number of previously processed sequential locations of each of the plurality of instances of each respective unique data element within the baseline dataset relative to a current sequential location of the baseline dataset, computing an encoding for the baseline dataset according to a distribution of the weight function computed for the plurality of unique data elements in the baseline dataset, and creating a compressed dataset according to the encoding.

According to a second aspect, a computer implemented method of compressing a baseline dataset comprising a sequence of a plurality of instances of a plurality of unique data elements, the method comprises: providing a weight function that calculates a decreasing value for a weight for each one of the plurality of instances of each one of the plurality of unique data elements in the baseline dataset, as a function of increasing number of previously processed sequential locations of each of the plurality of instances of each respective unique data element within the baseline dataset relative to a current sequential location of the baseline dataset, computing an encoding for the baseline dataset according to a distribution of the weight function computed for the plurality of unique data elements in the baseline dataset, and creating a compressed dataset according to the encoding.

According to a third aspect, a system for compressing a baseline dataset comprising a sequence of a plurality of instances of a plurality of unique data elements, the system comprises: at least one hardware processor executing a code for: providing a weight function that calculates an increasing value for a weight for each one of the plurality of instances of each one of the plurality of unique data elements in the baseline dataset, as a function of increasing number of previously processed sequential locations of each of the plurality of instances of each respective unique data element within the baseline dataset relative to a current sequential location of the baseline dataset, computing an encoding for the baseline dataset according to a distribution of the weight function computed for the plurality of unique data elements in the baseline dataset, and creating an output dataset according to the encoding.

According to a fourth aspect, a computer implemented method of compressing a baseline dataset comprising a sequence of a plurality of instances of a plurality of unique data elements, comprises: providing a weight function that calculates a weight for each one of the plurality of instances of each one of the plurality of unique data elements in the baseline dataset, as a function of sequential locations of each of the plurality of instances of each respective unique data element within the baseline dataset, computing an encoding for the baseline dataset according to a distribution of the weight function computed for the plurality of unique data elements in the baseline dataset, and creating a compressed dataset according to the encoding.

In a further implementation form of the first, second, third, and fourth aspects, further comprising: applying a reversible transformation that rearranges the instances of the unique data elements in an original dataset resulting in the baseline dataset.

In a further implementation form of the first, second, third, and fourth aspects, the reversible transformation comprises the Burrows-Wheeler Transform (BWT).

In a further implementation form of the first aspect, computing the encoding for the baseline dataset and creating the compressed dataset comprises: creating an output dataset storing the encoding for the sequence of the plurality of instances of the plurality of data elements in the baseline dataset, wherein the encoding is according to a compression rule defining data elements associated with a relatively higher weight as being associated with intervals of numbers in a defined interval that are relatively longer in comparison to data elements associated with relatively lower weight, dynamically creating the compressed dataset by sequentially iterating, for each current sequential location of the baseline dataset: determining a respective interval mapped to the respective data element of the current sequential location according to the weight function, and adjusting a plurality of respective intervals of the output dataset according to the current weights to maintain the compression rule.

In a further implementation form of the first aspect, computing the encoding for the baseline dataset and creating the compressed dataset comprises: creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight, dynamically creating the compressed dataset by sequentially iterating, for each current sequential location of the baseline dataset: determining an encoded data element mapped to the respective data element of the current sequential location according to the weight function, and adjusting the codewords of the output dataset according to the current weights to maintain the compression rule.

In a further implementation form of the first, second, third, and fourth aspects, the dynamically creating the compressed dataset is implemented as a statistical encoder.

In a further implementation form of the first, second, third, and fourth aspects, the dynamically creating the compressed dataset is implemented as a statistical encoder.

In a further implementation form of the first, second, third, and fourth aspects, the statistical encoder is selected from a group consisting of: adaptive arithmetic coding, and Prediction by Partial Mapping (PPM) using arithmetic coding.

In a further implementation form of the first, second, third, and fourth aspects, the statistical encoder is selected from a group consisting of: dynamic Huffman coding, and Prediction by Partial Mapping (PPM) using Huffman coding.

In a further implementation form of the first aspect, the weight function computes a relatively larger weight for data elements that are sequentially closer to the current sequential location and computes a relatively smaller weight for data elements that are sequentially further to the current sequential location.

In a further implementation form of the first aspect, the weight function computes the weight of a certain instance of a certain data element at the current sequential location as a function of values of the weight function computed for each instance of the certain data element for previous sequential locations previous to the current sequential location.

In a further implementation form of the first aspect, the weight function computes the weight of the certain instance of the certain data element at the current sequential location as the function of values of the weight function computed for each instance of the certain data element for previous sequential locations previous to the current sequential location within a sliding window of a selected size of sequential locations, wherein the sliding window is advanced to each respective current sequential location at each iteration, wherein data elements located externally to the sliding window are ignored in the computation of the weight by the weight function or assigned a value of zero.

In a further implementation form of the first aspect, the weight function computes the weight of the certain instance of the certain data element at the current sequential location as a sum of values of the weight function computed for each instance of the certain data element for previous sequential locations previous to the current sequential location.

In a further implementation form of the first aspect, further comprising: dividing the baseline dataset into a plurality of sequential blocks, wherein the weight function computes the weight of the certain instance of the certain data element at the current sequential location, by assigning a same value to all instances of the certain data element within each respective block regardless of location within the respective block, wherein the same value assigned to all instances of the certain data element within a current block is a constant multiple of the same value assigned to all instances of the certain data element within a previous sequential block.

In a further implementation form of the first aspect, further comprising: dividing the baseline dataset into a plurality of sequential blocks, wherein for each sequential block interval, a contribution to the weight of each respective location of a certain unique data element in a current sequential block is exponentially related to a respective corresponding previous location of the certain unique data element of the current sequential block by a first constant, and weights within the current sequential block are exponentially related to previous sequential blocks by a second constant.

In a further implementation form of the first aspect, the first constant comprises a k-th root of the second constant, wherein k denotes a size indicative of number of data elements in each of the plurality of sequential blocks.

In a further implementation form of the first, second, third, and fourth aspects, further comprising: selecting a sub-set of the baseline dataset, in a plurality of iterations: selecting different sizes for the plurality of sequential blocks, computing a processing time and a compression performance for the sub-set compressed using a current selected size for the sequential blocks, and selecting the size of the plurality of sequential blocks according to a trade-off between processing time and compression performance meeting a requirement and/or according to a set of rules.

In a further implementation form of the first, second, third, and fourth aspects, further comprising: selecting a sub-set of the baseline dataset, in a first plurality of iterations: increasing a size of the plurality of sequential blocks, computing an entropy of the sub-set compressed using a current size for the sequential blocks, identifying a maximum block size in response to detecting a rise in the entropy above a threshold, and in a second plurality of iterations: iteratively reducing the maximum block size, computing an entropy of the sub-set compressed using a current size for the sequential blocks, and selecting the size for the plurality of sequential blocks when a local minimum of the entropy is obtained.

In a further implementation form of the first, second, third, and fourth aspects, the compressed dataset is provided to a decoder for decoding with no header or a negligible header that excludes initial weights for the unique data elements in the baseline dataset computed for a first location of the baseline dataset.

In a further implementation form of the first, second, third, and fourth aspects, further comprising: analyzing a distribution of unique data elements in a prefix of the baseline dataset, in response to detecting a statistically significant fluctuation in the distribution, selecting the weight function that calculates the increasing value for the weight, in response to detecting no statistically significant fluctuation in the distribution, selecting a constant function for the weight function that quantifies a number of occurrences of each unique data element without considering sequential location.

In a further implementation form of the first, second, third, and fourth aspects, further comprising initializing a weighted tree associated with the values of the weight function computed for each of the plurality of data elements for a first sequential position, and the output dataset is considered as being equivalent to the weighted tree, the weighted tree having a number of leaves corresponding to a number of unique data elements.

In a further implementation form of the first, second, third, and fourth aspects, the weight tree comprises a Huffman tree.

In a further implementation form of the first, second, third, and fourth aspects, the baseline dataset having a baseline data storage size is compressed to generate the compressed dataset having a data storage size that is smaller than the baseline data storage.

In a further implementation form of the first, second, third, and fourth aspects, the data elements are selected as belonging to an alphabet.

In a further implementation form of the first, second, third, and fourth aspects, the alphabet is selected from the group consisting of: ASCII, EBCDIC, and UNICODE.

In a further implementation form of the first, second, third, and fourth aspects, the alphabet includes elements, each of which is a string of at least one character.

In a further implementation form of the first, second, third, and fourth aspects, the elements are words of a natural language.

In a further implementation form of the second aspect, computing an encoding for the baseline dataset and computing the compressed dataset comprises: creating an output dataset storing a codeword for each one of the unique data elements in the baseline dataset, wherein codewords are according to a compression rule defining data elements associated with a relatively lower weight as being associated with codewords that are relatively shorter in comparison to data elements associated with relatively lower weight, dynamically creating the compressed dataset by sequentially iterating, for each current sequential location of the baseline dataset: determining an encoded data element mapped to the respective data element of the current sequential location according to the weight function, and adjusting the codewords of the output dataset according to the current weights to maintain the compression rule.

In a further implementation form of the second aspect, computing the encoding for the baseline dataset and creating the compressed dataset comprises: creating an output dataset storing the encoding for the sequence of the plurality of instances of the plurality of data elements in the baseline dataset, wherein the encoding is according to a compression rule defining data elements associated with a relatively lower weight as being associated with intervals that are relatively longer in comparison to data elements associated with relatively higher weight, dynamically creating the compressed dataset by sequentially iterating, for each current sequential location of the baseline dataset: determining a respective interval mapped to the respective data element of the current sequential location according to the weight function, and adjusting a plurality of respective intervals of the output dataset according to the current weights to maintain the compression rule.

In a further implementation form of the second aspect, the weight function computes a relatively smaller weight for data elements that are sequentially closer to the current sequential location and computes a relatively larger weight for data elements that are sequentially further to the current sequential location.

In a further implementation form of the second aspect, further comprising: dividing the baseline dataset into a plurality of sequential blocks, wherein the weight function computes the weight of the certain instance of the certain data element at the current sequential location, by assigning a same value to all instances of the certain data element within each respective block regardless of location within the respective block, wherein the same value assigned to all instances of the certain data element within a current block is a division of the same value assigned to all instances of the certain data element within a previous sequential block that equals a constant, wherein a maximum value of the weight function is equal to the constant multiplied by the size of one of the sequential blocks.

In a further implementation form of the second aspect, further comprising: dividing the baseline dataset into a plurality of sequential blocks, wherein for each sequential block interval, a contribution to the weight of each respective location of a certain unique data element in a current sequential block is exponentially related to a respective corresponding later location of the certain unique data element of the current sequential by a first constant, and weights within the current sequential block are exponentially related to later sequential blocks by a second constant, wherein the second constant comprises a k-th root of the first constant, wherein k denotes a size indicative of number of data elements in each of the plurality of sequential blocks, wherein a maximum value of the weight function is equal to the second constant multiplied by two and multiplied by the size of one of the sequential blocks.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 3 is a table summarizing coding for $T=a^{32}b^{32}a$ using different coding approaches, in accordance with some embodiments of the present invention;

FIG. 7 which includes a table presenting the compression performance of static, b-adp, f-adp, b-2, and b-weight, defined as relative size, in percent, of the compressed file as compared to that of the original file, in accordance with some embodiments of the present invention;

FIG. 9 is a table presenting results of another set of experiments where the arithmetic encoders is Prediction by Partial Matching (PPM), of order 2 and 3, in accordance with some embodiments of the present invention; and FIG. 10 is a table presenting the compression performance for a baseline dataset created by applying the BWT reversible transform on a prefix of size 4K, in accordance with some embodiments of the present invention.

DETAILED DESCRIPTION

Figure 1:
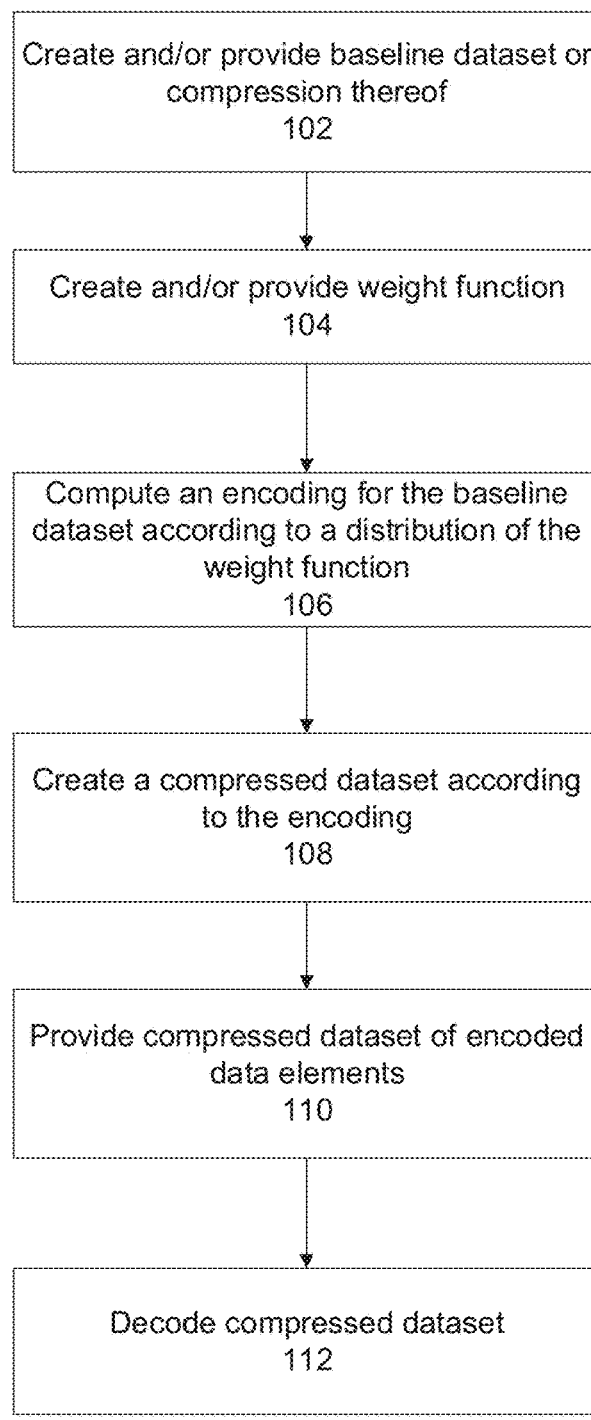
FIG. 1 is a flowchart of a method of compressing a baseline dataset according to a distribution of a weight function that calculates an increasing (or decreasing) weight for data elements in the baseline dataset, in accordance with some embodiments of the present invention.

The present invention, in some embodiments thereof, relates to data compression and, more specifically, but not exclusively, to systems and methods for creation of a compressed dataset.

An aspect of some embodiments of the present invention relates to systems, methods, an apparatus, and/or code instructions (i.e., stored in a data storage device, executable by one or more hardware processors) for compressing a baseline dataset according to an encoding computed for the baseline dataset, the encoding computed according to a distribution of a weight function computed for unique data elements in the baseline dataset. The baseline dataset includes a sequence of instances of data elements, for example, a file of text, where the data elements are defined as individual characters, or where the data elements are defined as words, and/or symbols (e.g., text and/or non-text) where the symbols may be defined as individual symbols and/or sets of two or more symbols (e.g., strings). The data elements, each one of which appears one or more times in the baseline dataset, are defined by a set, for example, an alphabet and/or set of symbols and/or set of characters.

The baseline dataset may be transformed in an optional preprocessing phase by means of a reversible transformation, the aim of which is to rearrange the data elements of the baseline dataset into a more compressible form. An example of such a reversible transformation is known as the Burrows-Wheeler Transform (BWT) (e.g., as described with reference to Burrows, Michael; Wheeler, David J. (1994), *A block sorting lossless data compression algorithm, Technical Report* 124, *Digital Equipment*, included herein by reference in its entirety). Compression of the baseline dataset created by applying the transformation to an original dataset may be improved in comparison to compression of the original dataset (i.e., without applying the transformation), for example, as described with reference to an experiment performed by inventors in the "Examples" section below.

The weight function calculates an increasing (or alternatively a decreasing) value for a weight for each one of the instances of each one of the unique data elements in the baseline dataset, as a function of increasing number of previously processed sequential locations of each of the instances of each respective unique data element within the baseline dataset relative to a current sequential location of the baseline dataset. The compressed dataset may be created by a statistical encoder, for example, adaptive arithmetic coding, Prediction by Partial Mapping (PPM) using arithmetic coding, dynamic Huffman coding, and Prediction by Partial Mapping (PPM) using Huffman coding. The storage size of the compressed dataset may be smaller than the storage size of the non-compressed baseline dataset. It is noted that in some implementations, for example for data-sets that are non-compressible such as a completely random dataset, the compressed dataset may be larger than the non-compressed dataset. The compressed dataset may be provided to an encoder for decompressing the compressed dataset to obtain the baseline dataset.

An aspect of some embodiments of the present invention relates to systems, methods, an apparatus, and/or code instructions (i.e., stored in a data storage device, executable by one or more hardware processors) for compressing a baseline dataset according to an encoding computed for the baseline dataset, the encoding computed according to a weight function. The baseline dataset includes a sequence of instances of data elements, for example, a file of text, where the data elements are defined as individual characters, or where the data elements are defined as words, and/or symbols (e.g., text and/or non-text) where the symbols may be defined as individual symbols and/or sets of two or more symbols (e.g., strings). The data elements, each one of which appears one or more times in the baseline dataset, are defined by a set, for example, an alphabet and/or set of symbols and/or set of characters. The weight function calculates a weight for each one of the instances of each one of the unique data elements in the baseline dataset, as a function of sequential locations of each of the instances of each respective unique data element within the baseline dataset. The compressed dataset may be created by a statistical encoder, for example, adaptive arithmetic coding, Prediction by Partial Mapping (PPM) using arithmetic coding, dynamic Huffman coding, and Prediction by Partial Mapping (PPM) using Huffman coding. The storage size of the compressed dataset is smaller than the storage size of the non-compressed baseline dataset. The compressed dataset may be provided to an encoder for decompressing the compressed dataset to obtain the baseline dataset.

At least some implementations of the systems, methods, apparatus, and/or code instructions (i.e., stored in a data storage device and executable by one or more hardware processors) improve the field of data compression, in particular, improve upon the data compression process based on standard encoding approaches, for example, Huffman based encoding and/or arithmetic based encodings. The improvement in data compression improves performance of a data storage device and/or network, by requiring fewer data storage resources for storage of the compressed dataset and/or requiring fewer network resources for transmission of the compressed dataset (e.g., smaller bandwidth), in comparison to a dataset compressed using standard encoding approaches. The improvement in compression is at least obtained by creating a compressed dataset according to an encoding computed for the baseline dataset according to a distribution of a weight function computed for the unique data elements in the baseline dataset. The weight function calculates an increasing (or alternatively a decreasing) value for a weight for each one of the instances of each one of the unique data elements in the baseline dataset, as a function of increasing number of previously processed sequential locations of each of the instances of each respective unique data element within the baseline dataset relative to a current sequential location of the baseline dataset.

Inventors discovered that assigning relatively higher (or alternatively lower) weights to data elements that are relatively closer to a current location of a currently processed data element in the baseline dataset being encoded increases compression performance.

Data Compression techniques are often classified into static and dynamic methods. While the probability distribution used for static models stays constant throughout the coding process, traditional dynamic models progressively accumulate the information about the symbols, and the codeword of the current symbol is derived as a function of what has already been seen. For example, entropy-based dynamic methods, such as Huffman (e.g., as described with reference to David A. Huffman. *A method for the construction of minimum-redundancy codes. Proceedings of the IRE,* 40(9):1098-1101, 1952, included herein by reference in its entirety) or arithmetic coding (e.g., as described with reference to Ian H. Witten, Radford M. Neal, and John G. Cleary. *Arithmetic coding for data compression. Commun. ACM,* 30(6):520-540, 1987, included herein by reference in its entirety), extract symbol frequency statistics on the basis of the processed prefix of the file, while dictionary-based methods, such as LZSS (e.g., as described with reference to James A. Storer and Thomas G. Szymanski. *Data compression via textural substitution. J. ACM,* 29(4):928-951, 1982 included herein by reference in its entirety), use this information in order to locate reoccurring sub-strings.

Well known adaptive methods based on Huffman coding are the one-pass solutions of the FGK algorithm by Faller (e.g., as described with reference to Newton Faller. *An adaptive system for data compression.* In *Record of the 7-th Asilomar Conference on Circuits, Systems and Computers,* pages 593-597, 1973 included herein by reference in its entirety), Gallager (e.g., as described with reference to Robert Gallager. *Variations on a theme by Huffman. IEEE Transactions on Information Theory,* 24(6):668-674, 1978 included herein by reference in its entirety) and Knuth (e.g., as described with reference to Donald E. Knuth. *Dynamic Huffman coding. Journal of Algorithms,* 6(2):163-180, 1985 included herein by reference in its entirety) and the enhanced algorithm by Vitter (e.g., as described with reference to Jeffrey S. Vitter. *Design and analysis of dynamic Huffman codes. JACM,* 34(4):825-845, 1987 included herein by reference in its entirety). The adaptation of arithmetic coding to work with dynamically changing probabilities is much simpler and only requires a redistribution of the intervals according to the updated probability distributions. All traditional adaptive models assume that the distribution of elements within a prefix of the input file is a good estimate for the distribution within the data to come later in the file.

A header holding necessary meta information is often included in the output files of classical dynamic compression techniques, and its size is usually negligible. Newer dynamic methods, however, use a significantly larger header, and its information may be exploited to achieve a more compact encoding part. Forward-looking adaptive coding (e.g., as described with reference to Shmuel T. Klein, Shoham Saadia, and Dana Shapira. *Forward looking Huffman coding. Theory of Computing Systems,* pages 1-20, 2020 included herein by reference in its entirety) transmits the frequencies of the symbols in the entire file as the prelude of the compressed file. The frequencies are then gradually updated to reflect the true frequencies in the remaining part of the file by decrementing the frequency of the character that is currently being processed. A hybrid method, encompassing both classical and forward-looking approaches, is proposed in Aharon Fruchtman, Shmuel T. Klein, and Dana Shapira. *Bidirectional adaptive compression.* In *Proceedings of the Prague Stringology Conference* 2019, pages 92-101, 2019, incorporated herein by reference in its entirety: the metadata is not transmitted as a bulk at the beginning of the file but rather gradually, each time a new character is encountered.

U.S. Provisional Patent Application No. 62/952,516 teaches adaptive coding formulates static and adaptive entropy-based coding mechanisms using a certain function template. In particular, it distinguishes between the classic and newer variants of the adaptive coding families, referring to them as backward and forward looking coding procedures, respectively, and their corresponding functions differ only by their domain interval. Furthermore, U.S. Provisional Patent Application No. 62/952,516 introduces a new compression scheme referred to as Forward weighted coding, which takes the idea of forward-looking one step further, and proposes an index-based weighted method. That is, rather than treating all positions in the input file in the same way, it suggests to assign higher priorities to positions that are close to the currently processed one, by means of weights that depend on the position within the file. The weight for each index is represented by a function, and the total weight assigned to a character $\sigma$ is the sum of the values of the function on the indices at which $\sigma$ occurs, within a given interval.

Forward-looking coding has been proven to be better than static Huffman coding by at least m−1 bits, where m denotes the size of the alphabet, and has a better worst case size than the classic dynamic Huffman coding. The hybrid method and the forward-weighted coding have been shown to always perform at least as good as forward-looking, and the weighted variant even presents better results in practice. As stated above, the main drawback of all forward approaches is, however, the large header of their output files, as opposed to backward-looking coding, which enjoys a header of negligible size.

At least some implementations of the systems, methods, apparatus, and/or code instructions described herein operate differently than, and/or improve upon, existing compression approaches, including the existing approaches described herein. The approach of at least some implementations of the systems, methods, apparatus, and/or code instructions described herein is sometimes referred to herein as Backward-Weighted. In at least some embodiments, the Backward-Weighted approach provides the technical advantages of both backward and weighted coding methods. In at least some embodiments, the Backward-Weighted approach provides reduced overhead of the header. The reduction of the header size may provide, for example, for real time compression, such as during real time generation of data. For example, compression of real time measurements by sensors (e.g., imaging sensors, audio sensors, other sensors that collect large amounts of data continuously and/or at short intervals), such as for transmission over a network, such as a wireless network. In at least some embodiments, the Backward-Weighted approach provides better (e.g., than other compression approaches described herein) compression on homogeneous data, for which a large enough prefix already encapsulates the essential statistics of the entire files.

A mathematical analysis and/or computational experimental results that provide evidence that compression using at least some implementations of the systems, methods, apparatus, and/or code instructions described herein (denoted Backward-Weighted) is at least as good as compression of other compression approaches described herein (and/or other known approaches not described herein) is provided below.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
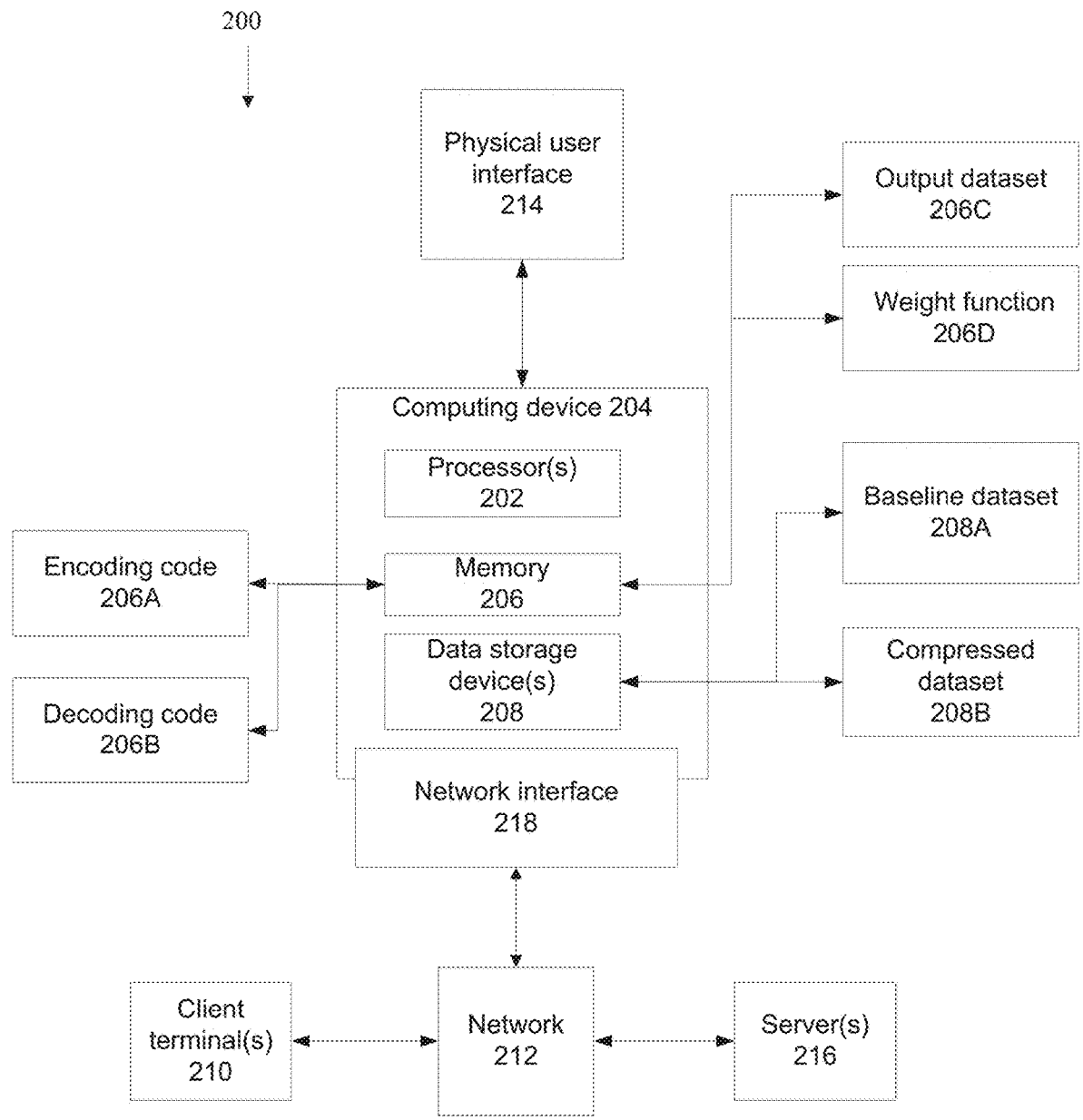
FIG. 2 is a block diagram of a system for compressing a baseline dataset according to a distribution of a weight function that calculates an increasing (or decreasing) weight for data elements in the baseline dataset, in accordance with some embodiments of the present invention.

Reference is now made to FIG. 1, which is a flowchart of a method of compressing a baseline dataset according to a distribution of a weight function that calculates an increasing (or decreasing) weight for data elements in the baseline dataset, in accordance with some embodiments of the present invention. Reference is also made to FIG. 2, which is a block diagram of components of a system 200 for compressing a baseline dataset according to a distribution of a weight function 206D that calculates an increasing (or decreasing) weight for data elements in the baseline dataset, in accordance with some embodiments of the present invention. System 200 may implement the acts of the method described with reference to FIG. 1, by processor(s) 202 of a computing device 204 executing code instructions (e.g., code 206A) stored in a memory 206 (also referred to as a program store).

Computing device 204 may be implemented as, for example one or more and/or combination of: a group of connected devices, a client terminal, a server, a virtual server, a computing cloud, a virtual machine, a sensor, a camera, a cellular phone, a desktop computer, a thin client, a network node, a network server, and/or a mobile device (e.g., a Smartphone, a Tablet computer, a laptop computer, a wearable computer, glasses computer, and a watch computer).

Different architectures of system 200 may be implemented, for example:

Computing device 204 may be implemented as one or more servers (e.g., network server, web server, a computing cloud, a virtual server, a network node) that provides services to multiple client terminals 210 over a network 212, for example, software as a service (SaaS), free compression and/or decompressing services, and/or other remote services.

Communication between client terminal(s) 210 and computing device 204 over network 212 may be implemented, for example, via an application programming interface (API), software development kit (SDK), functions and/or libraries and/or add-ons added to existing applications executing on client terminal(s), an application for download and execution on client terminal 210 that communicates with computing device 204, function and/or interface calls to code executed by computing device 204, a remote access section executing on a web site hosted by computing device 204 accessed via a web browser executing on client terminal(s) 210, client terminal(s) 210 may be implemented as thin clients and/or slaves and/or users of computing device 204, for example, sensors that sense large amount of data and transmit the data to computing device for compression thereof.

In another example, client terminal 210 provides the baseline dataset to computing device 204, and receive back the compressed dataset. In yet another example, client terminal 210 provides the baseline dataset to computing device 204, and computing device 204 stores the compressed dataset, and/or provides the compressed dataset to another server. In yet another example, the baseline dataset is already stored on computing device 204, and/or obtained from another server, and the compressed dataset is stored on computing device 204 and/or provide to client terminal 210.

Computing device 204 may be implemented as a standalone device (e.g., client terminal, smartphone, smart television, computing cloud, virtual machine, kiosk, sensor) that includes locally stored code that implement one or more of the acts described with reference to FIG. 1. For example, computing device 204 may be implemented as a sensor that senses data (i.e., baseline dataset) and compresses the sensed data to compute the compressed dataset. In another example, computing device 204 may be implemented as a cellular phone that compressed speech for transmission over the wireless and/or cellular network to another phone. In another example, computing device 204 may be implemented as a data storage server that receives data, and compresses the data for storage. In yet another example, computing device 204 may be implemented as a camera that captures an images and compresses the image.

Hardware processor(s) 202 of computing device 204 may be implemented, for example, as a central processing unit(s) (CPU), a graphics processing unit(s) (GPU), field programmable gate array(s) (FPGA), digital signal processor(s) (DSP), and application specific integrated circuit(s) (ASIC). Processor(s) 202 may include a single processor, or multiple processors (homogenous or heterogeneous) arranged for parallel processing, as clusters and/or as one or more multi core processing devices.

Memory 206 stores code instructions executable by hardware processor(s) 202, for example, a random access memory (RAM), read-only memory (ROM), and/or a storage device, for example, non-volatile memory, magnetic media, semiconductor memory devices, hard drive, removable storage, and optical media (e.g., DVD, CD-ROM). Memory 206 stores code 206A-B that implements one or more features and/or acts of the method described with reference to FIG. 1 when executed by hardware processor(s) 202. Memory 206 may store encoding code 206A that compressed the baseline dataset into the compressed dataset, and/or decoding code 206B that de-compresses the compressed dataset into the baseline dataset, and/or output dataset 206C that stores a mapping between data elements and codewords (e.g., for encoding using dynamic Huffman coding, and/or Prediction by Partial Mapping (PPM) using Huffman coding) and/or output dataset 206C stores encoding for the sequence of the plurality of instances of the plurality of data elements in the baseline dataset (e.g., for encoding using adaptive arithmetic coding, and/or Prediction by Partial Mapping (PPM) using arithmetic coding), and/or a weight function 206D that calculates an increasing value for a weight for each one of the instances of each one of the unique data elements in the baseline dataset, as a function of increasing number of previously processed sequential locations of each of the instances of each respective unique data element within the baseline dataset relative to a current sequential location of the baseline dataset, as described herein.

It is noted that encoding code 206A and/or decoding code 206B may be stored on client terminal 210 and/or server 216 and/or computing device 204 and/or other devices (not shown).

Computing device 204 may include data storage device(s) 208 for storing data, for example, baseline dataset 208A (i.e., data for compression) and/or compressed dataset 208B (i.e., baseline dataset after compression). Data storage device(s) 208 may be implemented as, for example, a memory, a local hard-drive, virtual storage, a removable storage unit, an optical disk, a storage device, and/or as a remote server and/or computing cloud (e.g., accessed using a network connection).

It is noted that baseline dataset 208A and/or compressed dataset 208B may be stored on client terminal 210 and/or server 216 and/or computing device 204 and/or other devices (not shown).

Network 212 may be implemented as, for example, the internet, a broadcast network, a local area network, a virtual network, a wireless network, a cellular network, a local bus, a point to point link (e.g., wired), and/or combinations of the aforementioned.

Computing device 204 may include a network interface 218 for connecting to network 212, for example, one or more of, a network interface card, an antenna, a wireless interface to connect to a wireless network, a physical interface for connecting to a cable for network connectivity, a virtual interface implemented in software, network communication software providing higher layers of network connectivity, and/or other implementations.

Computing device 204 and/or client terminal(s) 210 include and/or are in communication with one or more physical user interfaces 214 that include a mechanism for user interaction, for example, to enter data (e.g., select the baseline dataset for compression thereof, select and/or define the weight function) and/or to view data (e.g., view the decompressed data).

Exemplary physical user interfaces 214 include, for example, one or more of, a touchscreen, a display, gesture activation devices, a keyboard, a mouse, and voice activated software using speakers and microphone.

Computing device 204 may communicate with one or more of the following over network 212:

Client terminal(s) 210, for implementing the different architectures described herein.

Server(s) 216, for implementing the different architectures described herein.

Client terminal(s) 210 and/or server(s) 216 may be implemented as, for example, as a desktop computer, a server, a sensor, a camera, a virtual server, a network server, a web server, a virtual machine, a thin client, a cellular telephone, a smart phone, and a mobile device.

At 102, a baseline data is provided and/or created. The baseline dataset is the non-compressed dataset for compression. The baseline dataset may be, for example, manually selected by a user for compression (e.g., using a graphical user interface) and/or automatically selected by code (e.g., code that manages backup data, code that compresses data for transmission over a network) and/or data that is received in real time (e.g., output of a sensor).

Optionally, a reversible transformation is applied. The reversible transform rearranges the instances of the unique data elements in an original dataset resulting in the baseline dataset. Examples of the reversible transformation include the identity transformation and the Burrows-Wheeler Transform.

The baseline dataset includes multiple sequentially arranged data elements. Data elements are re-used, such that each data elements appears multiple times within the baseline dataset. Data elements of the baseline dataset may be defined by a set of unique data elements, for example, an alphabet, text letters, symbols (e.g., non-text, and/or including both text and non-text), text words, words (e.g., non-text words, and/or including both text and non-text words, and/or words including both text and/non-text symbols). The set of unique data elements (each one of which may be repeated multiple times in the baseline dataset) may sometimes be referred to as an alphabet. The alphabet may include, for example, ASCII characters and/or symbols, EBCDIC characters and/or symbols, UNICODE characters and/or symbols, and letters of a natural language. The alphabet may include elements, each of which is a string of one or more characters, for example, words of a natural language. In non-text datasets, for example, images, the set of unique data elements may be defined using other approaches, for example, pixel intensity values, and/or a set of binary values encoding one or more pixels.

Optionally, the entire baseline dataset is available, for example, stored in a data storage device, for example a stored file. Alternatively or additionally, a portion of the baseline dataset is not yet available, for example, does not yet exist, and/or has not yet been received (e.g., not yet transmitted by a remote server), and/or not yet available (e.g., file stored on data storage device is dynamically updated and does not yet include portions of the baseline dataset for encoding). For example, the baseline dataset stores digitized audio recorded during a phone conversation and/or images captured in real time by an image sensor. Such baseline dataset cannot store audio that has not yet been spoken and recorded and/or image that have not yet been captured, although such audio and/or images are scheduled for compression. In such a case, the baseline dataset may be dynamically created and encoded, as described herein.

At 104, a weight function is created and/or selected and/or provided. The weight function calculates an increasing value (or alternatively a decreasing value) for a weight for each one of the instances of each one of the unique data elements in the baseline dataset, as a function of increasing number of previously processed sequential locations of each of the instances of each respective unique data element within the baseline dataset relative to a current sequential location of the baseline dataset. The baseline dataset may be sequentially processed.

It is noted that the decreasing value for increasing distance from the current location is an alternative implementation to increasing value for increasing distance. The decreasing value implementation may be selected, for example, when the increasing values become very large, and most computationally costly (e.g., in terms of memory and/or processor utilization) in comparison to using decreasing values. Both implementations are described herein.

Inventors discovered that assigning relatively higher (or lower) weights to data elements that are relatively closer to the current location in the baseline dataset being encoded increases compression performance, as described herein.

The weight function is a backward weight function based on backward looking data elements. The weight of a certain instance of a certain data element at a current sequential location (i.e., being processed during the current iteration) is computed as a function (e.g., sum, multiplication, weighted multiplication, other functional implementations) of values of the weight function computed for each instance of the certain data element for previous sequential locations previous to the current sequential location being processed during the current iteration.

The weight function may compute a relatively larger weight for data elements that are sequentially closer to the current sequential location and computes a relatively smaller weight for data elements that are sequentially further to the current sequential location. Alternatively, the weight function may compute a relatively smaller weight for data elements that are sequentially closer to the current sequential location and computes a relatively larger weight for data elements that are sequentially further to the current sequential location.

The weight function may compute the weight of a certain instance of a certain data element at the current sequential location as a function of values of the weight function computed for each instance of the certain data element for previous sequential locations previous to the current sequential location. Optionally, the weight function computes the weight of the certain instance of the certain data element at the current sequential location as a sum (or other aggregation function, such a multiplication, weighted sum, and the like) of values of the weight function computed for each instance of the certain data element for previous sequential locations previous to the current sequential location.

Optionally, the weight function computes the weight of the certain instance of the certain data element at the current sequential location as the function of values of the weight function computed for each instance of the certain data element for previous sequential locations previous to the current sequential location within a sliding window of a selected size of sequential locations. The sliding window is advanced to each respective current sequential location at each iteration. Data elements located externally to the sliding window are ignored in the computation of the weight by the weight function or assigned a value of zero. The size of the sliding window may be selected, for example, based on a trade-off between compression performance and processing time, such as according to a set-of-rules that define the trade-off. For example, the larger the window, the better the compression performance at a cost of higher processing time. The smaller the window, the lower the processing time at a cost of decreased compression performance.

Optionally, the type of weight function is selected. The selection may be based on an analysis of distribution of unique data elements in a prefix of the baseline dataset. The prefix may be, for example, a fixed number of data elements and/or a percentage of the total size of the baseline dataset, for example the first 1000 data elements, and/or 1-5% of the first data elements. The distribution of data elements in the prefix may be assumed to represent the distribution of data elements in the rest of the baseline dataset. Optionally, in response to detecting a statistically significant fluctuation in the distribution, the weight function that calculates the increasing value for the weight is selected. Alternatively, in response to detecting no statistically significant fluctuation in the distribution, a constant function may be selected for the weight function that quantifies a number of occurrences of each unique data element without considering sequential location.

Optionally, the baseline dataset is divided into multiple sequential blocks. The weight function is computed according to each sequential block, as detailed herein. Optionally, all blocks are of equal size, with no overlap between blocks. Exemplary processes for selecting block sizes are now described. Block size may be selected based on a sub-set of the baseline dataset, for example, a fixed number of data elements and/or a percentage of the total size of the baseline dataset, for example the first 1000 data elements, and/or 1-5% of the first data elements. In a first exemplary implementation, different sizes for the sequential blocks are iteratively selected, for example, sequentially increasing values, increasing based on a function, and/or randomly. A processing time and/or a compression performance is computed for the sub-set compressed using the current selected size for the sequential blocks. The size of the sequential blocks is selected according to a trade-off between processing time and compression performance meeting a requirement and/or according to a set of rules. In a second exemplary implementation, a size of the sequential blocks is iteratively increased in a first set of iterations. An entropy of the sub-set is compressed using the current size for the sequential blocks. A maximum block size in response to detecting a rise in the entropy above a threshold is identified. The maximum block size is iteratively reduced in a second set of iterations. An entropy of the sub-set compressed using the current size for the sequential blocks is computed. The size for the sequential blocks is selected when a local minimum of the entropy is obtained.

Optionally, the weight function is implemented as what is referred to herein as a "b-2" function. The b-2 function is computed using the sequential blocks obtained by dividing the baseline dataset. The weight function computes the weight of the certain instance of the certain data element at the current sequential location, by assigning a same value to all instances of the certain data element within each respective block regardless of location within the respective block. The same value assigned to all instances of the certain data element within a current block is a constant multiple of the same value assigned to all instances of the certain data element within a previous sequential block. Alternatively, the same value assigned to all instances of the certain data element within the current block is a division of the same value assigned to all instances of the certain data element within a previous sequential block that equals a constant. A maximum value of the weight function is equal to the constant multiplied by the size of one of the sequential blocks.

Alternatively or additionally, the weight function is implemented as what is referred to herein as a "b-weight" function. The b-weight function is computed using the sequential blocks obtained by dividing the baseline dataset. For each sequential block interval, a contribution to the weight of each respective location of a certain unique data element in a current sequential block is exponentially related to a respective corresponding previous location of the certain unique data element of the current sequential block by a first constant. Weights within the current sequential block are exponentially related to previous sequential blocks by a second constant. The first constant may be a k-th root of the second constant, where k denotes a size indicative of number of data elements in each of the sequential blocks.

Mathematical representations and/or definitions are now discussed. For sake of completeness, some definitions which were discussed with reference to U.S. Provisional Patent Application 62/952,516, formalize entropy based compression methods, are provided herein.

Given is a file denoted $T=T[1,n]$ of n characters over an alphabet $\Sigma$ of size m. A general weight $W(g,\sigma,\ell,u)$ may be defined based on four parameters, where $g: [1,n] \to \mathbb{R}^+$ is a non negative function defined on the integers that assigns a positive real number as a weight to each position $i \in [1,n]$ within T; $\sigma \in \Sigma$ is a character of the alphabet; and $\ell$ and u are the boundaries of an interval, $1 \leq \ell \leq u \leq n$, serving to restrict the domain of the function g. The value of the weight $W(g,\sigma,\ell,u)$ is defined for each character $\sigma \in \Sigma$, as the sum (or other aggregation approach) of the values of the function g for all positions j in the range $[\ell,u]$ at which a occurs, that is $T[j]=\sigma$. Formally, $$W(g,\sigma,\ell,u)=\Sigma_{\{\ell \leq j \leq u | T[j]=\sigma\}} g(j).$$

According to Backward Weighted coding implemented in at least some embodiments described herein, the intervals are of the form $[\ell,u]=[1,i-1]$. That is, the term Backward refers to the positions that have already been processed, and $$W(g,\sigma,1,i-1)=\Sigma_{\{1 \leq j \leq i-1 | T[j]=\sigma\}} g(i).$$

Figure 3:
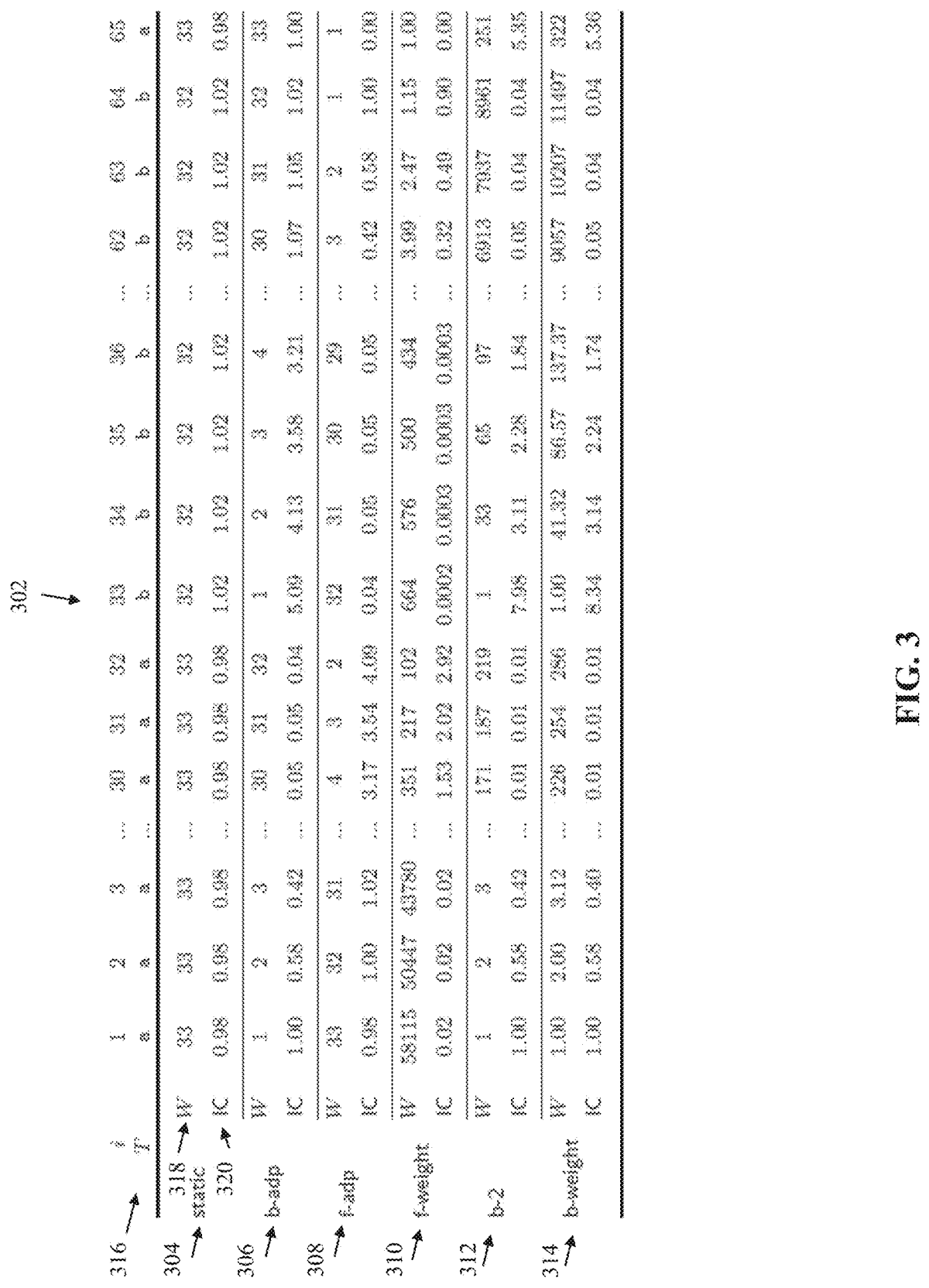

Reference is now made to FIG. 3 which is a table 302 summarizing coding for $T=a^{32}b^{32}a$ using different coding approaches, in accordance with some embodiments of the present invention. The different described approaches include static 304, b-adp 306, f-adp 308, f-weight 310, b-2 312, and b-weight 314, which are described in additional detail below. Columns 316 indicate the values of the weight (W) 318 and Information Content (IC) 320, $-\log p_i$, for each of the 65 characters of T, for each compression approach 304-314. As a running example, the short string $T=x_1 \ldots$ $x_{65}=a^{32}b^{32}a$ is studied. Table 302 illustrates the effectiveness of the Backward-weight approach described herein 312-314 as compared to other approaches 304-310 on the running example T.

Static encoding 304 is the special case for which the weight $W(g,\alpha,\ell,u)=W(1,\sigma,1,n)$ is constant for all indices, in which g is the constant function $1\equiv g(i)=1$ for all i.

Static compression 304 for T considers the probability weights 33/65 and 32/65 for a and b. The corresponding IC 320, $-\log p_i$, is 0.978 and 1.022 for a and b, respectively, for an average of 0.9998 bits per symbol of T for the encoding itself.

The traditional adaptive coding, denoted b-adp 306, is a special case of using a backward weight in which g(i)=1 for all i, where the weights are recomputed for all indices $1\leq i<n$ according to backward weights:

$W(1,\sigma,1,i-1)=\Sigma_{\{1\leq j\leq i-1|T[j]=\sigma\}}1$=number of occurrences of $\sigma$ in $T[1,i-1]$.

At position 33 of T of b-adp 306, for example, just before processing the first occurrence of b, the weights for a and b are 33 and 1, including the initial value 1 for each character, and the IC for b at that position is $$-\log\left(\frac{1}{34}\right) = 5.09 \text{ bits.}$$

The forward looking encoding, denoted f-adp 308, uses at position i the forward interval [i,n], and the function g(i)=1 for all i in the notation above. That is, $W(1,\sigma,i,n)=\Sigma_{\{i\leq j\leq n|T[j]=\sigma\}}1$=number of occurrences of $\sigma$ in $T[i,n]$. The f-adp encoding for the running example herein initializes the weights of the characters {a,b} to 33 and 32, exactly as in static. However, unlike static, the count for $x_i$ is decremented after processing each character of T. The value at position i for f-adp is the remaining number of occurrences of the character $x_i$ from position i to the end of T, and the probability is obtained by dividing these counts by the total number of remaining characters. As example, returning to Table 302, at position 33, there are only a single a and 32 b's left in T, and the IC for b at that point is $$-\log\left(\frac{32}{33}\right) = 0.04 \text{ bits.}$$

However, as mentioned, the f-adp approach suffers from an expensive header for the description of the exact frequencies of the involved characters. Note that the encoding of the last symbol in any input file is not needed, since the decoder also determines that the alphabet of the remaining suffix of the input text contains only a single symbol. In fact, the encoding is redundant also in case of a long run of identical symbols at the end of the file. This is true also for all forward looking techniques and the cost contributed to the total space by this last run is zero, as can be seen in the last cells for both forward methods.

The forward weighted coding, denoted f-weight 310, as described with reference to U.S. Provisional Patent Application 62/952,516, gives increased consideration to closer rather than to more distant locations, using a decreasing function g instead of a constant one. $g_{f\text{-}weight}(i)=1.15^{n-i}$ is applied for the weight function on the running example described herein, which belongs to the better family of compression functions as described with reference to U.S. Provisional Patent Application 62/952,516. Formally, for each $\sigma\in\Sigma$, the weight function $W(1.15^{n-i},\sigma,i,n)=\Sigma_{\{i\leq j\leq n|T[j]=\sigma\}}1.15^{n-i}$, is considered, and its values on indices of a in the forward range T[i,n] are summed. Considering again the cell i=33 as example, the equation $\Sigma_{i=33}^{64} 1.15^{65-i}=664$, is computed since the characters b occur contiguously from position 33 to 64. The value for the last b, at position 64, is 1.15. As in all forward methods, there is no encoding for the last symbol as it is known to the decoder.

The interval under consideration for the Backward Weighted approach described herein is a prefix of the input file, however, unlike traditional adaptive coding, the function g to be used is not fixed. The goal is, therefore, to choose functions that are likely to produce shorter encoding.

Texts having nearly the same probability distribution of the occurrences of their characters independently of the location in the text would not be sensitive to whether a simple or complex weight function is used, and even a constant function only quantifying the number of occurrences will do. In contrast, if the distribution is strongly fluctuating along the text, a variable weight function can be more beneficial. In f-weight 310 a monotonically decreasing function is used. If the encoder approaches an interval in which a character $\sigma$ appears densely, but afterwards $\sigma$ has rather low probability in the remaining portion of the input file, f-adp 308 will fail to identify $\sigma$'s local density and will rather encode it based on $\sigma$'s global probability. However, f-weight 310 has the ability to identify $\sigma$'s high probability, so that the encoding is shortened.

B-weight 314, which is an implementation of the Backward Weighted coding approach described herein, implements the variable weight function described above. The assumption is that the probability distribution of the characters about to be encoded is more similar to the distribution in the recently coded interval, rather than to the ones seen further back in the past. Therefore, the distribution maintained by the model may be more similar to the most recent distribution, without eliminating completely the knowledge the model has about earlier seen characters. A decreasing function was used in the f-weight 310 example in order to assign larger weights to the following characters to be encoded than to those that are further ahead. Symmetrically, in b-weight 314, the weights of closer characters is increased, i.e., those that have just been coded, at the price of those which are farther behind, and this is achieved by using an increasing function g.

Backward weighted encoding is now described in more detail.

An example of a scheme that does not treat all previous indices in the same way is the sliding window approach, in which the active window of size k is determined by the interval [i−k,i−1] for position i. This can be reformulated by a backward weighted coding in which the function g is defined by $$g(j) = \begin{cases} 1 & i-k \leq j < i, \\ 0 & \text{otherwise} \end{cases}.$$

It is noted that more than two decades ago, motivated by hardware constraints, Nelson (e.g., as described with reference to Mark Nelson and Jean-Loup Gailly. *The Data Compression Book*. M & T Books, 1996 included herein by reference in its entirety) proposed a variant of adaptive Huffman coding where weights were rescaled from time to time (i.e., non-fixed) in order to make sure that each character frequency may be represented by 16 bits to avoid overflow errors. In contrast, at least some implementations described herein compute weights for fixed intervals (the size of which may be selected as described herein), for example, by dividing each fixed interval by a constant value, to improve compression rates.

In contrast to the sliding window approach, the division model does not completely ignore the distributions of data elements (e.g., characters) from the beginning of the baseline dataset (also referred to herein as input file), but rather gives them less importance than closer ones. A different backward method based on the division by 2, denoted herein as b-2 $312$, uses a selected and/or fixed number k of characters between the division points, rather than letting this number be controlled by technical issues like possible overflow in the representation of frequencies. The contribution to W of all positions within the same block is identical, and double the contribution assigned to the indices in the preceding block. That is, for each pair of indices i and i+k the function g based on b-2, dented $g_{b-2}$ fulfils the relation $g_{b-2}(i+k)=2g_{b-2}(i)$ or, recursively as $$g_{b-2}(i) = \begin{cases} 1 & 1 \le i \le k \\ 2g_{b-2}(i-k) & \text{otherwise} \end{cases},$$

that may resemble the sliding window function. The above is equivalent, in closed form, to $$g_{b-2}(i) = 2^{\lfloor \frac{i-1}{k} \rfloor}.$$

It is noted that a different value for the constant, other than 2, may be selected and used in the above definition. In practice the weights may be rescaled periodically, which does not affect the corresponding probabilities.

A weighted version denoted b-weight $314$ is based on the division by 2. As described herein, the value 2 is an example that is not necessarily limiting, as other values may be selected. In some implementations, rather than keeping a constant ratio between blocks of fixed size k, but using the same values within a block, a hierarchy is created by considering a refined version of $$g_{b-2}: g_{b-weight}(i) = \left(\sqrt[k]{2}\right)^{i-1} \text{ for } i \ge 1,$$

yielding a fixed ratio between adjacent indices.

Like for the function $g_{b-2}$, the fixed ratio of 2 between blocks is also maintained:

$$g_{b-weight}(i+k) = \left(\sqrt[k]{2}\right)^{i+k-1} = \left(\sqrt[k]{2}\right)^{i-1} \cdot \left(\sqrt[k]{2}\right)^{k} = 2 \cdot \left(\sqrt[k]{2}\right)^{i-1} = 2g_{b-weight}(i)$$

Figure 4:
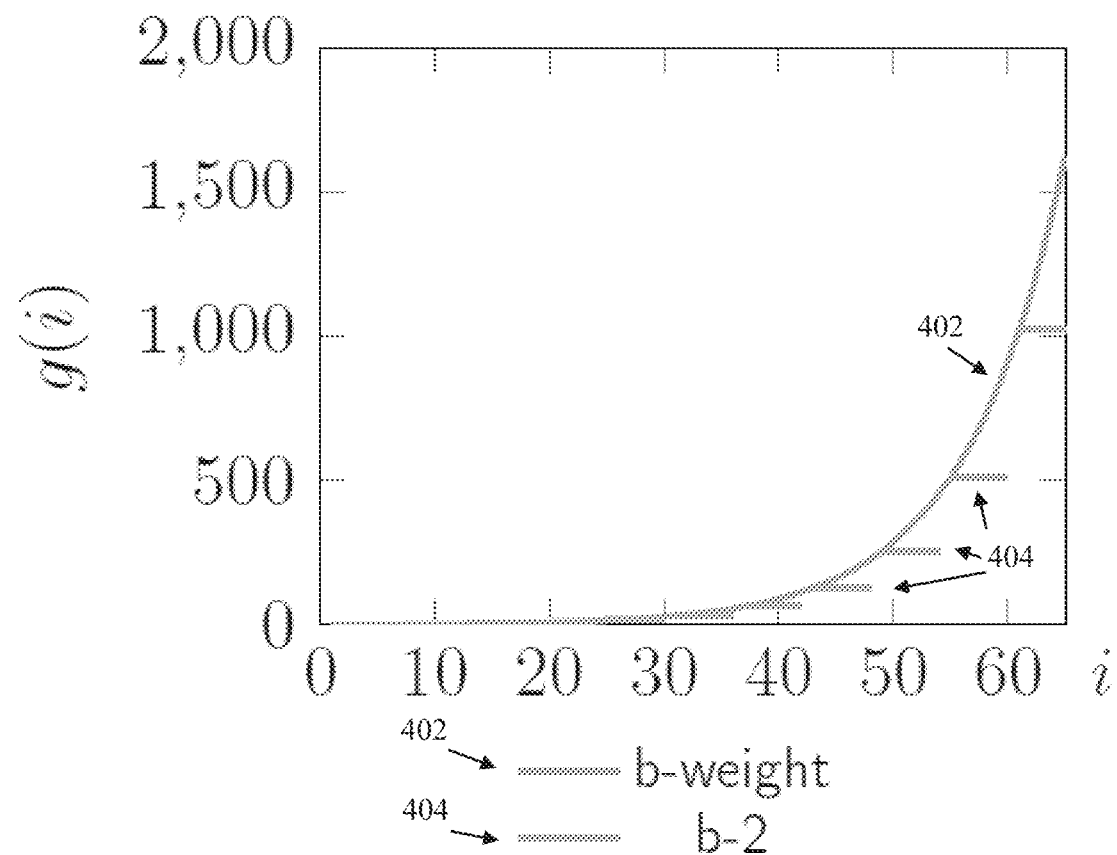
FIG. 4 includes a graph of $g_{b\text{-}weight}$ as compared to a graph of $h_{b\text{-}2}$, in accordance with some embodiments of the present invention.

Reference is now made to FIG. 4, which includes a graph of $g_{b-weight}$ $402$ as compared to a graph of $g_{b-2}$ $404$, in accordance with some embodiments of the present invention. FIG. 4 depicts a comparison of smoothness of $g_{b-weight}$ $402$ as compared to $g_{b-2}$ $404$.

Referring now back to the running example, as depicted with reference to FIG. 3, backward based approaches b-adp $306$, b-2 $312$, and b-weight $314$, initialize the weight of the first encountered b at position 33 by 1, and thus require more space for their encoding than the other approaches. However, learning curves of the backward based approaches, indicated by decreasing values for b on the range of [33,64], show their ability to adjust themselves to new distributions. As depicted in table $302$, b-2 $312$ and b-weight $314$ learn the new distribution faster, and provide smaller ICs already from position 34 as compared to b-adp $306$.

Figure 5:
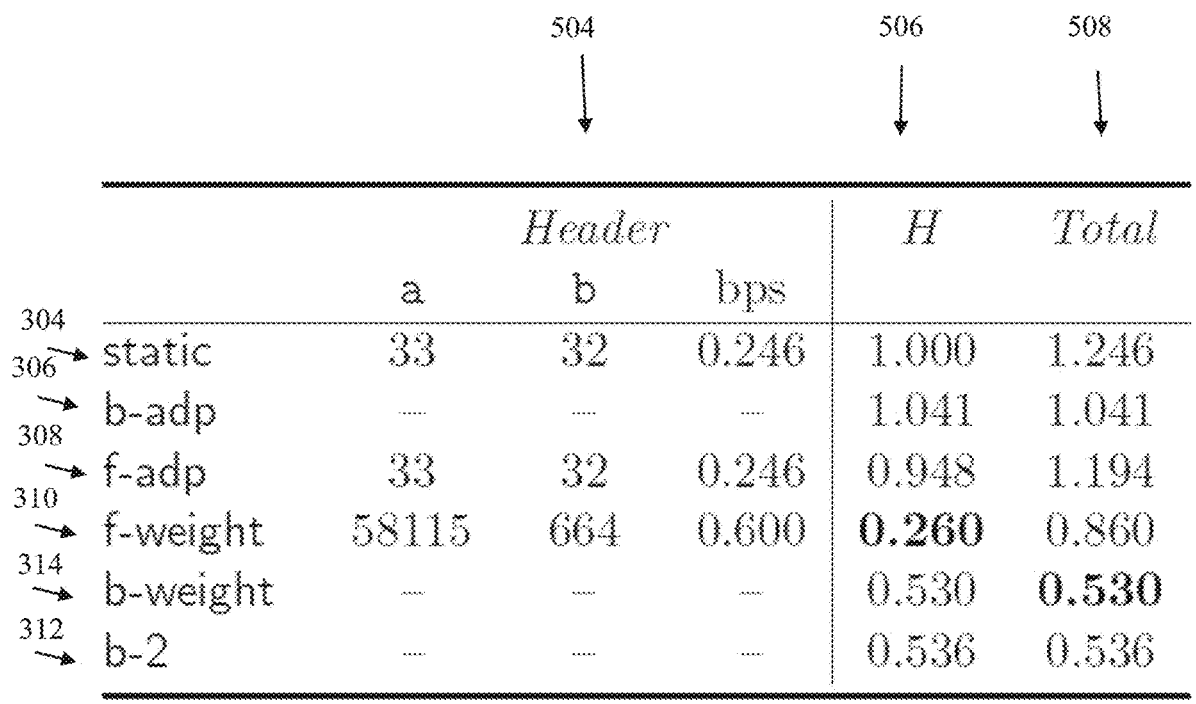
FIG. 5 is a table summarizing the storage requirement per symbol of the different encodings described herein, in accordance with some embodiments of the present invention.

Reference is now made to FIG. 5, which is a table $502$ summarizing the storage requirement per symbol of the different encodings approaches $304$-$314$ described herein (e.g., with reference to FIG. 3 and/or the running example), in accordance with some embodiments of the present invention. The first three columns $504$ of table $502$ indicate the header of the compressed file, indicating the initial weights of the symbols and the corresponding storage cost in bits per symbol (bps). The encoding of these values may be done, for example, by means of a Fibonacci code (e.g., as described with reference to Shmuel T. Klein and Miri Kopel Ben-Nissan. *On the usefulness of Fibonacci compression codes.* Comput. J., 53(6):701-716, 2010 included herein by reference in its entirety) using about 1.44 $\log_2$ m bits to encode the integer m.

It is noted that no header (e.g., indicating the initial weights of the symbols and/or the corresponding storage cost in bits per symbol (bps)) is needed for the backward based approaches, b-adp $306$, b-2 $312$, and/or b-weight $314$.

Column $506$ indicates the entropy H of the net encoding. Column $508$ indicates the total storage summing up the former values. The best attained compression for each component on this example is highlighted in bold. Note that the net encoding per symbol is the best for f-weight $310$, but it requires a costly header. The best overall savings are attained by b-weight $314$, which is slightly better than b-2 $312$. The example illustrates that the knowledge of the future is obviously invaluable, but comes at the price of an expensive header overhead. The backwards techniques, although being heuristics, only need an empty or negligible header, and are likely to perform better in practice.

Selecting the constant k (e.g., the size of the sliding window) for b-2 and b-weight may be performed, for example, via a trial and error process, optionally resulting in a trade-off between processing time and compression performance. Too small values of k cause the model to be updated too often, while for large values of k, the model takes larger portions of the history into account, which might be irrelevant. Both extreme choices have a negative effect on compression efficiency, and the entropy can be roughly seen as a concave function of k. Inventors experimented with exponentially increasing values of k until the resulting entropy has started rising, and then narrowed the interval by checking the entropy in the middle of the interval, until a local minimum has been obtained. Inventor's experiments indicate that preprocessing even a small prefix of the file suffices to find satisfying values of k.

The functions b-2 and b-weight may produce exponentially growing numbers, which may imply an impractical implementation in terms of data storage requirement and/or processing time. To cope with this technical challenge, Inventors propose, for at least some embodiments, a change of point of view: for b-2, instead of multiplying by 2 every k characters, all current weights are divided by 2 (rounding up to avoid zeros), thereby maintaining equivalent distributions. Then all the weights are bounded by 2k, and thus can be scaled in order to use only integer arithmetic. Similarly, for b-weight, a division by 2 every k characters may be used. A bound of 4k for each weight may be obtained.

To justify the original chosen weights, an examination of the contribution at a particular position i relative to the accumulated values is now provided. Concentrating on backward methods (i.e., b-weight, b-2), which are defined by $(\ell,u)=(1,n-1)$, the following ratio is evaluated:

$$p(g, i) = \frac{g(i)}{S_{i-1}}, 2 \le i \le n,$$

where $S_{i-1}=\Sigma_{j=1}^{i-1}g(j)$ denotes the cumulative weight of the positions preceding the current one, and estimate its limit when $i\to\infty$. For b-adp, associated with $$g = 1, p(1, i) = \frac{1}{i-1} \to 0.$$

If the relative weights of newly seen characters tend to zero as in this case, then the model will hardly be updated with new contexts. The intuition behind the backward heuristic approaches derived herein (i.e., Backward weights, such as b-2 and/or b-weight) is to give higher priority to recent contexts and at the same time require that p(g,i) does not tend to zero.

For b-2 and a given constant k, it is first assumed that i is a multiple of k. In this case $S_{nk-1}=k\Sigma_{j=0}^{n-1}2^j=k(2^n-1)$, and $$p(g_{b-2}, nk) = \frac{g_{b-2}(nk)}{S_{nk-1}} = \frac{2^{n-1}}{k(2^n-1)-2^{n-1}} \to \frac{1}{2k-1}.$$

For other values of i, say, when i mod k=j with $1 \le j < k$, $$p(g_{b-2}, nk+j) =$$

$$\frac{g_{b-2}(nk+j)}{S_{nk}+(j-1)2^n} = \frac{2^{\lfloor\frac{nk+j-1}{k}\rfloor}}{k(2^n-1)+(j-1)2^n} = \frac{2^n}{2^n(k+j-1)-k} \to \frac{1}{k+j-1}.$$

In particular, the maximal value is achieved in each interval of size k for j=1, yielding $$\max_{0 \le j < k}(p(g_{b-2}, nk+j)) \to \frac{1}{k}.$$

That is, for large enough values of n, $p(g_{b-2},n)$ lies in the range $$\left[\frac{1}{2k-1}, \frac{1}{k}\right].$$

For b-weight and a given constant k, the cumulative values are $$S_{i-1} = \sum_{j=1}^{i-1} \sqrt[k]{2}^{j-1} = \frac{\sqrt[k]{2}^{i-1}-1}{\sqrt[k]{2}-1},$$

from which the following is derived:

$$p(g_{b-weight}, i) = \frac{\sqrt[k]{2}^{i-1}}{S_{i-1}} \to \sqrt[k]{2}-1.$$

Although the weights for b-2 have the desirable property of not tending to zero, the function does not maintain a constant factor between indices and fluctuates, that is, certain symbol locations are assigned higher relative weights than others. This preference of individual symbol locations has no justification and might hurt the compression efficiency. The advantage of b-weight over b-2 is that in addition of having its relative weights not tending to zero, the decay is monotonic and the resulting function is smoother.

Figure 6:
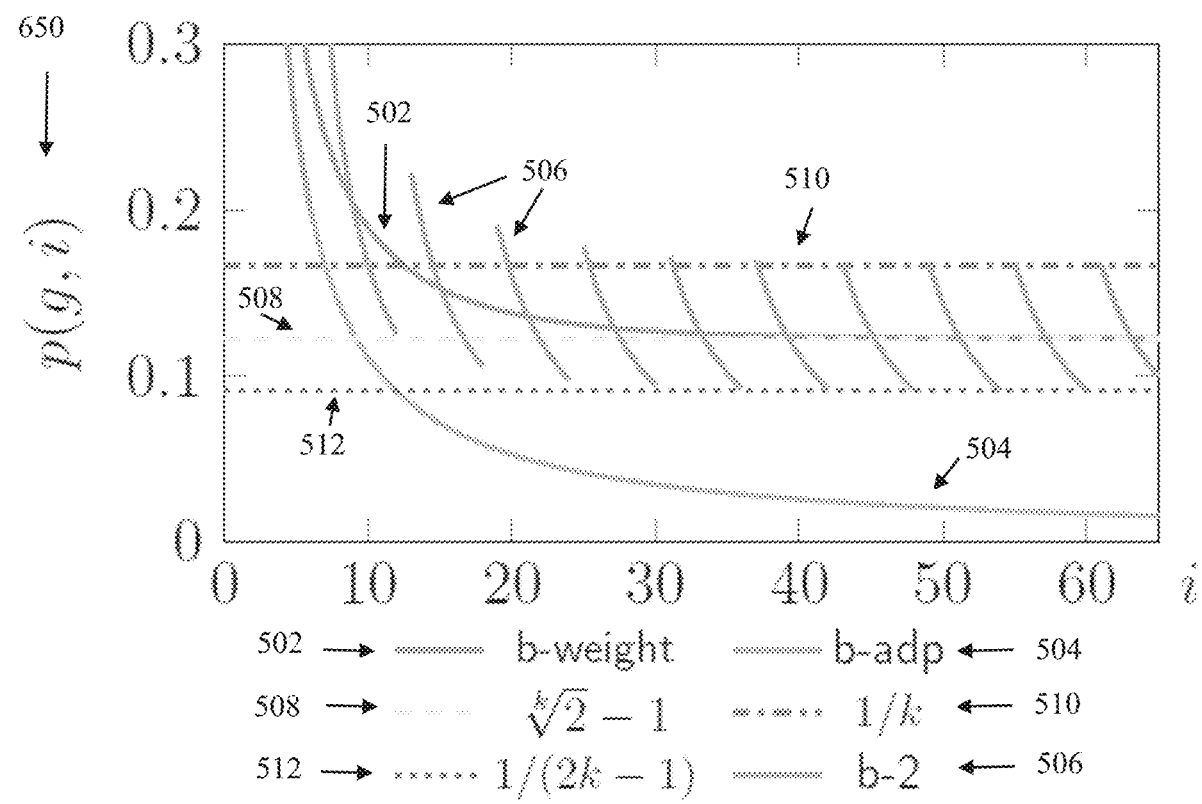
FIG. 6 is a graph depicting a visualization of $p(g,i)$ as a function of $i$ for the backward based approaches b-weight, b-adp, and b-2, using $k=6$, in accordance with some embodiments of the present invention.

Reference is now made to FIG. 6, which is a graph depicting a visualization of p(g,i) 650 as a function of i for the backward based approaches b-weight 502, b-adp 504, and b-2 506, using k=6, in accordance with some embodiments of the present invention. The broken lines show the limiting values of the interval for $g_{b-2}$ for $$\sqrt[k]{2}-1$$

(arrow 508), 1/k (arrow 510), and 1/(2k−1) (arrow 512).

Referring now back to 106 of FIG. 1, an encoding for the baseline dataset is computed according to a distribution of the weight function computed for the unique data elements in the baseline dataset.

Optionally, the systems, methods, apparatus, and/or code instructions described herein are designed to be easily adapted for compatibility with other existing compression processes. The adaptation may be performed by varying one or more parameters, as described herein. The adaptation provides compatibility with datasets compressed using other existing compression processes, and/or for compression of datasets into other existing compression processes, optionally without requiring installation and maintenance of multiple different encoders and decoders. Moreover, parameters of the systems, methods, apparatus, and/or code instructions described herein may be varied to create additional new encoding processes, while optionally providing compatibility between the different encoding processes.

To provide compatibility for static coding (e.g., standard Huffman coding), the weight $W(g,\sigma,\ell,u)=W(1,\sigma,1,n)$ is constant for all indices, in which g is the constant function $1 \equiv g(i)=1$ for all i.

To provide compatibility for typical adaptive coding (e.g., standard adaptive Huffman coding), a backward weight in which g(i)=1 for all i is used, where the weights are recomputed for all indices $1 \le i < n$ according to backward weights:

$W(1,\sigma,1,i-1)=\Sigma_{\{1 \le j \le i-1 | T[j]=\sigma\}}1$=number of occurrences of $\sigma$ in $T[1,i-1]$.

To provide compatibility for forward looking encoding, at position i the forward interval is denoted [i,n], and the function g(i)=1 is used for all i for the weight, i.e., $W(1,\sigma,i,n)=\Sigma_{\{i \le j \le n | T[j]=\sigma\}}1$=number of occurrences of $\sigma$ in $T[i,n]$.

The uses of the term function and weight used herein to refer to functions and/or weights computed based on sequential locations of data elements exclude constant values that are independent of sequential location.

At 108, a compressed dataset is computed and/or created according to the encoding. Optionally, the compressed dataset (which is provided to a decoder for decoding) includes no header (i.e., excludes a header) and/or includes a negligible header that excludes initial weights for the unique data elements in the baseline dataset computed for a first location of the baseline dataset. The lack of header is in contrast to other approaches that require a significantly sized header.

The baseline dataset having a baseline data storage size is compressed to generate the compressed dataset having a data storage size that is smaller than the baseline data storage.

Different approaches for computing the encoding and the compressed dataset, as described with reference to 106-108 may be implemented. Two exemplary approaches are now described.

A first exemplary approach is designed for creating the compression dataset using a statistical encoder, for example, adaptive arithmetic coding, and/or Prediction by Partial Mapping (PPM) using arithmetic coding. An output dataset storing the encoding for the sequence of the instances of the data elements in the baseline dataset is created. The encoding is according to a compression rule defining data elements associated with a relatively higher (or alternatively lower) weight as being associated with intervals of numbers (e.g., real numbers) within a defined range, for example, of the form [a,b), such that $0 \leq a < b \leq 1$, that are relatively longer in comparison to data elements associated with relatively lower weight (or alternatively higher weight). The compressed dataset is dynamically created by sequentially iterating the following for each current sequential location of the baseline dataset: determining a respective interval mapped to the respective data element of the current sequential location according to the weight function, and adjusting respective intervals of the output dataset according to the current weights to maintain the compression rule.

A second exemplary approach is designed for creating the compression dataset using a statistical encoder, for example, dynamic Huffman coding, and/or Prediction by Partial Mapping (PPM) using Huffman coding.

It is noted that other examples of statistical encoders are based on universal codes may be adapted for the first and/or second exemplary approaches. For example, Elias, Fibonacci, Golomb, Rice, and Shannon Fano.

An output dataset that stores a mapping between data elements and codewords is created and/or provided. Each one of the data elements in the baseline dataset is mapped to a corresponding codeword for encoding the respective data element.

The weights computed by the weight function and/or output dataset are used to compress the baseline dataset into the compressed dataset, by encoding the data elements of the baseline dataset into corresponding codewords, as described herein.

The output dataset maps each data element which may be defined by a set of data elements, to a single unique codeword. The baseline dataset may include one or more instances of each data element, for example, the set of data elements may be defined as an alphabet, and/or set of symbols and/or set of characters.

The output dataset and values computed by the weight function may be implemented as separate data structures, for example, tables, key-value pairs, pointers, trees, and the like. Each dataset may be managed independently, for example, updated and/or adjusted as described herein. For example, the values computed by the weight function are decreased, and the codewords of the output dataset are adjusted to maintain the compression rule.

Alternatively or additionally, the output dataset and values computed by the weight function are implemented in a common data structure, optionally a single dataset, for example, tables, key-value pairs, pointers, trees, and the like.

Optionally, a weighted tree associated with the values of the weight function computed for each of the data elements, is initialized with the weight function computed for each of the data elements for a first sequential position. The output dataset may be considered as being equivalent to the weighted tree, as two different trees, or as a single tree. Optionally, the coding dataset and/or values of the weight function are implemented as the weighted tree. The weighted tree may include a number of leaves corresponding to a number of the unique data elements. Each leaf node is associated with a certain data element, a certain codeword for encoding the certain data element, and the current weight of the certain data element. Higher up nodes may store a sum of the weights of their children nodes. The root node may store a sum of weights of all data elements, indicative of the number of data elements in the non-encoded portion of the baseline dataset remaining to be encoded.

Optionally, the weighted tree is implemented as a binary tree.

Optionally, the output dataset and/or weight tree are implemented as a Huffman tree. The compression rule may be according to the Huffman tree compression rule.

Optionally, the codewords in the output dataset are arranged according to a compression rule. The compression rule defines that data elements associated with a relatively higher weight are associated with codewords that are relatively shorter in comparison to data elements associated with relatively lower weight. For example, a certain data element with a weight of 15 has a codeword 010, and another data element with a lower weight of 5 has a longer codeword 11000110. In other words, the closer the occurrence(s) of a certain data element to the current location in the baselines dataset that is currently being encoded, the shorter its codeword. The shorter codewords for data elements sequentially located closer to the current location in the baseline dataset being encoded are selected to produce an overall compression of the baseline dataset.

Optionally, an initial state of the weight tree stores weights representing an actual distribution of the data elements in the baseline dataset. The actual distribution may be obtained by processing the entire baseline dataset, for example, counting the number of occurrences of each data element in the baseline dataset.

Alternatively or additionally, the weight of each one of the data elements in the initial baseline dataset stored is computed from one or more other datasets that are estimated to be statistically similar to the baseline dataset and/or are defined from the other dataset. For example, for encoding speech of a phone conversation, the dataset may be of prior phone conversations, for example, between the same two individuals. In another example, for encoding a newspaper article, the dataset may be other newspaper articles, for example, by the same author, appearing in the same online newspaper, and/or on the same topic. In yet another example, for encoding an image, the dataset may be other similar images, for example, of the same scene, in the same format, and/or taken by the same imaging sensor. Static Huffman coding may use a known distribution of the data elements corresponding to the nature of the baseline dataset, for example, English text with its well known character distribution, or use accurate probabilities for the specific input baseline dataset that are computed via a preprocessing stage. An advantage of using known statistics is saving the preprocessing stage, however, one then relies on the assumption that the given baseline dataset fits the assumed output dataset, which is not always the case. If there is too much discrepancy between the conjectured and the actual output dataset, there might be a loss in the compression gain.

Optionally, the set of data elements used for encoding are defined by the initial analysis of the entire baseline dataset. Alternatively or additionally, the set of data elements used for encoding are pre-defined, for example, based on ASCII codes.

The following features may be iterated for dynamically creating the compressed dataset by sequentially processing each respective data element of the baseline dataset:

An encoded data element is computed according to codeword mapped to the respective data element by the output dataset and/or the values computed by the weight function (e.g., weight tree).

The codewords of the output dataset are adjusted according to the current weight (i.e., computed for the currently processed location in the baseline dataset) to maintain the compression rule. For example, when the weight of the current data element being encoded is higher than other weights of other data elements, and the code word length of the current data element is longer than code word lengths of other data elements, the codewords are adjusted such that the codeword length of the current data element is now shorter than the codeword lengths of the other data elements. The code words are updated such that data elements having relatively higher weights have a code word of relatively shorter length than other data elements having relatively lower weights.

Optionally, the Huffman tree is updated, rather than reconstructing it from scratch after each character, using the sibling property, for example, as described by Gallager. Gallager describes that a tree is a Huffman tree if and only if it has the sibling property.

The sibling property is used to ensure that the updated tree is a Huffman tree. In terms of mathematical notation, the sibling property is defined as follows: A weighted binary tree with m leaves is said to have the sibling property if and only if:

1. The m leaves have nonnegative weights denoted $w_1, \ldots, w_m$, and the weight of each internal node is the sum of the weights of its two children; and 2. The nodes can be numbered in nondecreasing order by weight, so that the nodes indexed $2j-1$ and $2j$ in this numbering are siblings, for $1 \leq j \leq m-1$.

U.S. Provisional Patent Application No. 62/952,516 provides an example of how the Huffman tree is dynamically updated.

Features described herein for the second exemplary implementation are dynamically iterated for the sequentially arranged data elements of the baseline dataset. Each iteration results in an encoding of one data element, to create one encoded data element. The encoded data elements may be sequentially arranged to form the compressed dataset.

The value of the weight function corresponding to each current sequential location in the baseline dataset is used for encoding of the current data element. The encoded data element is mapped to the respective data element according to a current state of the output dataset, which was computed during the previous iteration for the previous data element. The output dataset is updated for the current respective data element, and used to encode the next data element in the sequence. In other words, act 108 of a certain iteration for a certain data element is followed by 106 of a next iteration for a next data element at the next sequential location of the baseline dataset.

Optionally, the sequential iterations are performed until a single unique data element with at least one instance (optionally multiple instances) remains in the remaining portion of the baseline dataset. In such a case, the output dataset excludes encodings of the remaining instance(s) of the single unique data element. The exclusion of the repeating instances of the last unique data element further reduces the total number of bits of the compressed dataset, in comparison to encoding each of the repeating instances. There is no need to encode a single copy of the last remaining element, since the decoder may deduce the data element (e.g., character) and the exact number of remaining occurrences from the current weight. For example, when the last portion of the baseline dataset is the sequence gggggggggggggg, rather than encoding each "g" into the compressed dataset, nothing needs to be encoded, saving the number of bits otherwise required to encoding the multiple repeating "g"'s. When the compressed dataset (i.e., created from the output dataset) is provided to a decoder for decompression, the decoder computes a number of the remaining instance(s) of the single unique data element according to the weight of the single data element computed by the weight function for a last sequential location. At the end of the compressed file, the decoder determines the only character that has not been encoded and the number of times to repeat this character based on its weight. Additional formal mathematical details are described herein.

The compressed dataset includes the encoded data elements of the baseline dataset.

At 110, the compressed dataset is provided. For example, the compressed dataset may be locally stored by the computing device, and/or forwarded to another computing device. The compressed dataset may be provided for decoding.

The compressed dataset is a compressed version of the baseline dataset.

The size of the compressed dataset may be smaller than the baseline dataset. The amount of memory and/or data storage device required to store the compressed dataset is smaller than the amount of memory and/or data storage device required to store the baseline dataset.

Optionally, the compressed dataset is provided to a decoder for decoding with no header or a negligible header that excludes initial weights for the unique data elements in the baseline dataset computed for a first location of the baseline dataset Optionally, the details of the chosen model on which the compression process relies, which are used for decoding the compressed dataset do not need to be necessarily adjoined to the compressed dataset, for example, the details of the chosen model are excluded from a header. When the model is learned adaptively, as in the traditional backward looking codings described herein, no description of the model is necessarily needed, since the model is updated by the encoder and the decoder in synchronization.

At 112, the compressed dataset may be decoded and/or decompressed into the baseline dataset. The compressed dataset may be decompressed by a decoder. For example, the compressed dataset may be locally decompressed by the computing device, and/or decompressed by another computing device.

The encoding and decoding processes may be implemented as being symmetrical.

Various embodiments and aspects of the present invention as delineated hereinabove and as claimed in the claims section below find calculated support in the following examples.

Examples

Reference is now made to the following examples of data compression, which together with the above descriptions illustrate some implementations of the systems, methods, apparatus, and/or code instructions described herein in a non limiting fashion.

Inventors performed computational evaluations to obtain empirical evidence on compression performance by at least some implementations of the backwards based approaches (e.g. b-2 and/or b-weight) described herein, in comparison to other standard approaches. The compression approaches were evaluated on different datasets, taken from the Pizza & Chili database (e.g., available at pizzachili(dot)dcc(dot) uchile(dot)cl), are of different nature and alphabets. Inventors focused on dataset of size 50 MB as the results were quite typical for all sizes.

Reference is now made to FIG. 7, which includes a table 702 presenting the compression performance of static 704, b-adp 706, f-adp 708, b-2 (columns 710), and b-weight 712, defined as relative size, in percent, of the compressed file as compared to that of the original file, in accordance with some embodiments of the present invention. Column 720 indicates different dataset that were compressed in different experimental runs. The datasets of table 702 were compressed using arithmetic coding. The value of k used to achieve the results of b-2 (columns 710) and b-weight 712 are reported in parentheses. For comparison, entropy of order 0, $H_0$ (column 716) is included. The best compression performance is highlighted in bold. As can be seen, the b-weight 712 approach consistently achieves the best results, and b-2 710 is at least as good as all others.

As for time performance, for each method, the times were averaged over 10 runs. On Inventor's implementation, the running time for b-2 and b-weight compression was about twice the time needed for b-adp, due to the search for a satisfying k on a prefix of the input file. As for decompression speed, b-weight was about 10% slower than b-adp, and b-2 was about 2% slower than b-adp.

Figure 8:
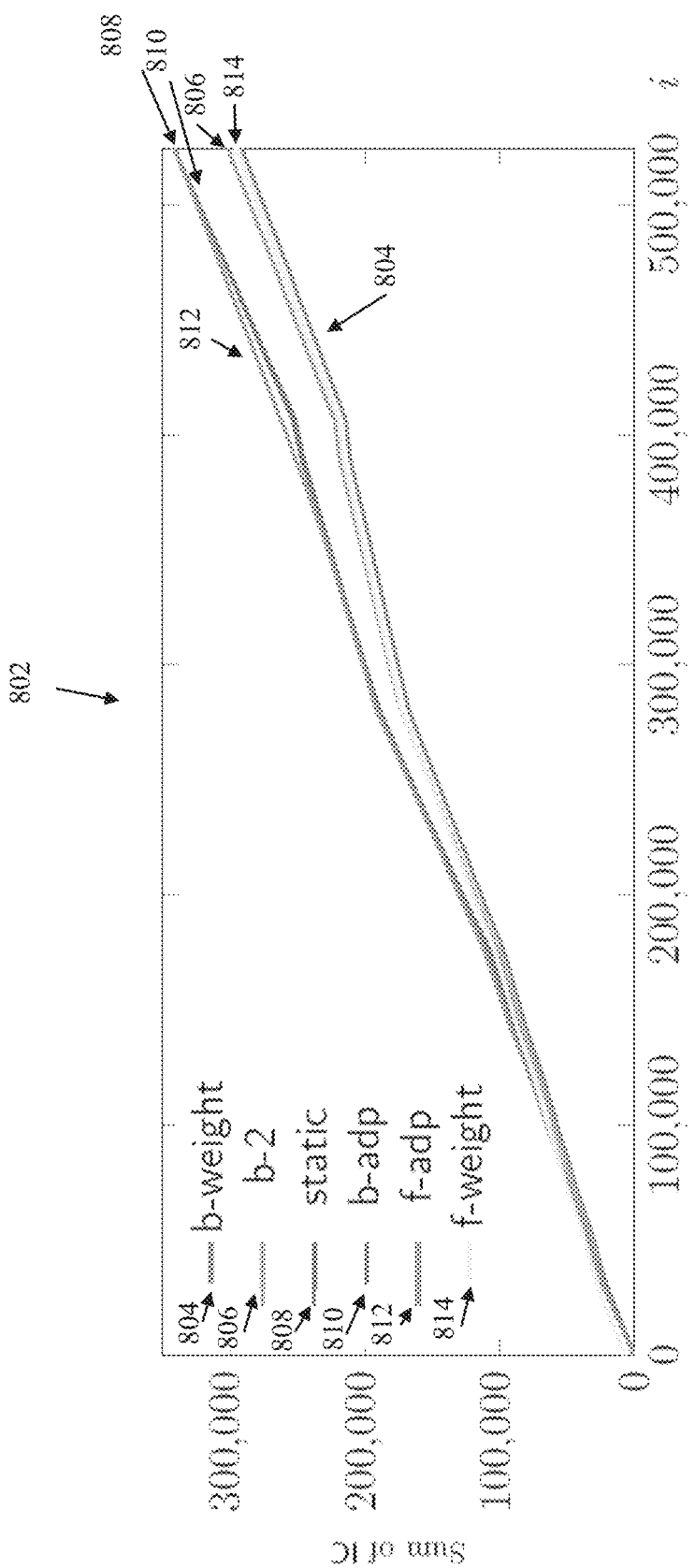
FIG. 8 is a graph presenting compression performance as function of the size of the processed prefix, in accordance with some embodiments of the present invention.

Reference is now made to FIG. 8, which is a graph 802 presenting compression performance as function of the size of the processed prefix, in accordance with some embodiments of the present invention. Compression performance is evaluated and shown for b-weight 804, b-2 806, static 808, b-adp 810, f-adp 812, and f-weight 814 approaches described herein. Graph 802 indicates that the advantage of the backward weighted approaches described herein (e.g., b-weight 804 and/or b-2 806) is preserved throughout the compression process. Graph 802 shows the performance for the input file sources on a prefix of size 512K to let the individual curves be distinguishable.

Reference is now made to FIG. 9, which is a table 902 presenting results of another set of experiments where the arithmetic encoders (e.g., used in the experiments whose results are presented in FIG. 7), is replaced by Prediction by Partial Matching (PPM) 904 as descried with reference to John Cleary and Ian Witten. *Data compression using adaptive coding and partial string matching. IEEE Transactions on Communications*, 32(4):396-402, 1984, included herein by reference in its entirety, of order 2 and 3, in accordance with some embodiments of the present invention. Table 902 also presents results for compression using the b-2 (columns 906) and b-weight 908 compression approaches. Table 902 include the entropy $H_r$ 910 of order r 912 for comparison. Column 912 indicates the different datasets used for different experimental runs. The weighting scheme is adapted to PPM: for each context C, the weights have been assigned only to the subtext consisting of the occurrences of this context and their following characters, and not sequentially to the entire text as for arithmetic coding. Note that order 3 is always preferable (in table 902) to 2 except for b-weight on pitches, for which no optimal value of k has been found, as indicated by the - dash in table 902.

Reference is now made to FIG. 10, which includes a table 1002 presenting the compression performance for a baseline dataset created by applying the BWT reversible transform on a prefix of size 4K, in accordance with some embodiments of the present invention. The baseline dataset created by applying the BWT reversible transform is compressed using static 1004, b-adp 1006, f-adp 1008, b-2 (columns 1006), and b-weight 1012 approaches. Compression performance is defined as relative size, in percent, of the compressed file as compared to that of the original file. Column 1020 indicates different dataset that were compressed in different experimental runs. The datasets of table 1002 were compressed using arithmetic coding. The best value is highlighted in bold. The results of table 1002 in which BTW was applied may be compared to the results of table 702 of FIG. 7 in which BTW was not applied. Inventor's experiments described herein provide computational and/or experimental evidence that the backwards weighted approaches, in accordance with at least some implementations described herein, is especially suitable for input files with locally skewed distributions and/or may improve the compression efficiency by more than 20% for arithmetic coding, and up to 7% or 2% for PPM of order 2 or 3, and up to 53% for BWT transformed texts, respectively, at a price of slower running times for compression, and comparable time for decompression.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant encodings will be developed and the scope of the term encoding is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

It is the intent of the applicant(s) that all publications, patents and patent applications referred to in this specification are to be incorporated in their entirety by reference into the specification, as if each individual publication, patent or patent application was specifically and individually noted when referenced that it is to be incorporated herein by reference. In addition, citation or identification of any reference in this application shall not be construed as an admission that such reference is available as prior art to the present invention. To the extent that section headings are used, they should not be construed as necessarily limiting. In addition, any priority document(s) of this application is/are hereby incorporated herein by reference in its/their entirety.

What is claimed is:

1. A computer implemented method of compressing a baseline dataset comprising a sequence of a plurality of instances of a plurality of unique data elements, the method comprising:
   providing a weight function that calculates an increasing value for a weight for each one of the plurality of instances of each one of the plurality of unique data elements in the baseline dataset, as a function of increasing number of previously processed sequential locations of each of the plurality of instances of each respective unique data element within the baseline dataset relative to a current sequential location of the baseline dataset;
   computing an encoding for the baseline dataset according to a distribution of the weight function computed for the plurality of unique data elements in the baseline dataset; and
   creating a compressed dataset according to the encoding, wherein the compressed dataset is provided to a decoder for decoding with no header or a negligible header that excludes initial weights for the unique data elements in the baseline dataset computed for a first location of the baseline dataset.

2. The method of claim 1, further comprising:
   applying a reversible transformation that rearranges the instances of the unique data elements in an original dataset resulting in the baseline dataset.

3. The method of claim 1, further comprising:
   analyzing a distribution of unique data elements in a prefix of the baseline dataset;
   in response to detecting a statistically significant fluctuation in the distribution, selecting the weight function that calculates the increasing value for the weight;
   in response to detecting no statistically significant fluctuation in the distribution, selecting a constant function for the weight function that quantifies a number of occurrences of each unique data element without considering sequential location.

4. The method of claim 1, wherein computing the encoding for the baseline dataset and creating the compressed dataset comprises:
   creating an output dataset storing the encoding for the sequence of the plurality of instances of the plurality of data elements in the baseline dataset,
   wherein the encoding is according to a compression rule defining data elements associated with a relatively higher weight as being associated with intervals of numbers in a defined interval that are relatively longer in comparison to data elements associated with relatively lower weight;
   dynamically creating the compressed dataset by sequentially iterating, for each current sequential location of the baseline dataset:
      determining a respective interval mapped to the respective data element of the current sequential location according to the weight function; and
      adjusting a plurality of respective intervals of the output dataset according to the current weights to maintain the compression rule.

5. The method of claim 1, wherein computing the encoding for the baseline dataset and creating the compressed dataset comprises:
   creating an output dataset storing a codeword for each one of the unique data elements in the baseline dataset, wherein codewords are according to a compression rule defining data elements associated with a relatively higher weight as being associated with codewords that are relatively shorter in comparison to data elements associated with relatively lower weight;

dynamically creating the compressed dataset by sequentially iterating, for each current sequential location of the baseline dataset:

determining an encoded data element mapped to the respective data element of the current sequential location according to the weight function; and adjusting the codewords of the output dataset according to the current weights to maintain the compression rule.

6. The method of claim 1, further comprising:

dividing the baseline dataset into a plurality of sequential blocks;

wherein for each sequential block interval, a contribution to the weight of each respective location of a certain unique data element in a current sequential block is exponentially related to a respective corresponding previous location of the certain unique data element of the current sequential block by a first constant, and weights within the current sequential block are exponentially related to previous sequential blocks by a second constant.

7. The method of claim 6, wherein the first constant comprises a k-th root of the second constant, wherein k denotes a size indicative of number of data elements in each of the plurality of sequential blocks.

8. The method of claim 6, further comprising:

selecting a sub-set of the baseline dataset;

in a plurality of iterations: selecting different sizes for the plurality of sequential blocks, computing a processing time and a compression performance for the sub-set compressed using a current selected size for the sequential blocks; and selecting the size of the plurality of sequential blocks according to a trade-off between processing time and compression performance meeting a requirement and/or according to a set of rules.

9. The method of claim 6, further comprising:

selecting a sub-set of the baseline dataset;

in a first plurality of iterations: increasing a size of the plurality of sequential blocks, computing an entropy of the sub-set compressed using a current size for the sequential blocks, identifying a maximum block size in response to detecting a rise in the entropy above a threshold; and in a second plurality of iterations: iteratively reducing the maximum block size, computing an entropy of the sub-set compressed using a current size for the sequential blocks, and selecting the size for the plurality of sequential blocks when a local minimum of the entropy is obtained.

10. The method of claim 1, wherein the weight function computes a relatively larger weight for data elements that are sequentially closer to the current sequential location and computes a relatively smaller weight for data elements that are sequentially further to the current sequential location.

11. The method of claim 1, wherein the weight function computes the weight of a certain instance of a certain data element at the current sequential location as a function of values of the weight function computed for each instance of the certain data element for previous sequential locations previous to the current sequential location.

12. The method of claim 11, wherein the weight function computes the weight of the certain instance of the certain data element at the current sequential location as the function of values of the weight function computed for each instance of the certain data element for previous sequential locations previous to the current sequential location within a sliding window of a selected size of sequential locations, wherein the sliding window is advanced to each respective current sequential location at each iteration, wherein data elements located externally to the sliding window are ignored in the computation of the weight by the weight function or assigned a value of zero.

13. The method of claim 11, wherein the weight function computes the weight of the certain instance of the certain data element at the current sequential location as a sum of values of the weight function computed for each instance of the certain data element for previous sequential locations previous to the current sequential location.

14. The method of claim 1, further comprising:

dividing the baseline dataset into a plurality of sequential blocks;

wherein the weight function computes the weight of the certain instance of the certain data element at the current sequential location, by assigning a same value to all instances of the certain data element within each respective block regardless of location within the respective block, wherein the same value assigned to all instances of the certain data element within a current block is a constant multiple of the same value assigned to all instances of the certain data element within a previous sequential block.

15. The method of claim 1, further comprising initializing a weighted tree associated with the values of the weight function computed for each of the plurality of data elements for a first sequential position, and the output dataset is considered as being equivalent to the weighted tree, the weighted tree having a number of leaves corresponding to a number of unique data elements.

16. A computer implemented method of compressing a baseline dataset comprising a sequence of a plurality of instances of a plurality of unique data elements, the method comprising:

providing a weight function that calculates a decreasing value for a weight for each one of the plurality of instances of each one of the plurality of unique data elements in the baseline dataset, as a function of increasing number of previously processed sequential locations of each of the plurality of instances of each respective unique data element within the baseline dataset relative to a current sequential location of the baseline dataset, wherein the weight function computes a relatively smaller weight for data elements that are sequentially closer to the current sequential location and computes a relatively larger weight for data elements that are sequentially further to the current sequential location;

computing an encoding for the baseline dataset according to a distribution of the weight function computed for the plurality of unique data elements in the baseline dataset; and creating a compressed dataset according to the encoding.

17. The method of claim 16, wherein computing an encoding for the baseline dataset and computing the compressed dataset comprises:

creating an output dataset storing a codeword for each one of the unique data elements in the baseline dataset, wherein codewords are according to a compression rule defining data elements associated with a relatively lower weight as being associated with codewords that are relatively shorter in comparison to data elements associated with relatively lower weight;

dynamically creating the compressed dataset by sequentially iterating, for each current sequential location of the baseline dataset:

determining an encoded data element mapped to the respective data element of the current sequential location according to the weight function; and adjusting the codewords of the output dataset according to the current weights to maintain the compression rule.

18. The method of claim 16, wherein computing the encoding for the baseline dataset and creating the compressed dataset comprises:

creating an output dataset storing the encoding for the sequence of the plurality of instances of the plurality of data elements in the baseline dataset, wherein the encoding is according to a compression rule defining data elements associated with a relatively lower weight as being associated with intervals that are relatively longer in comparison to data elements associated with relatively higher weight;

dynamically creating the compressed dataset by sequentially iterating, for each current sequential location of the baseline dataset:

determining a respective interval mapped to the respective data element of the current sequential location according to the weight function; and adjusting a plurality of respective intervals of the output dataset according to the current weights to maintain the compression rule.

19. The method of claim 16, further comprising:

dividing the baseline dataset into a plurality of sequential blocks;

wherein the weight function computes the weight of the certain instance of the certain data element at the current sequential location, by assigning a same value to all instances of the certain data element within each respective block regardless of location within the respective block, wherein the same value assigned to all instances of the certain data element within a current block is a division of the same value assigned to all instances of the certain data element within a previous sequential block that equals a constant, wherein a maximum value of the weight function is equal to the constant multiplied by the size of one of the sequential blocks.

20. The method of claim 16, further comprising:

dividing the baseline dataset into a plurality of sequential blocks;

wherein for each sequential block interval, a contribution to the weight of each respective location of a certain unique data element in a current sequential block is exponentially related to a respective corresponding later location of the certain unique data element of the current sequential by a first constant, and weights within the current sequential block are exponentially related to later sequential blocks by a second constant, wherein the second constant comprises a k-th root of the first constant, wherein k denotes a size indicative of number of data elements in each of the plurality of sequential blocks, wherein a maximum value of the weight function is equal to the second constant multiplied by two and multiplied by the size of one of the sequential blocks.

* * * * *